(12) United States Patent
Tobita

(10) Patent No.: US 8,175,216 B2
(45) Date of Patent: May 8, 2012

(54) SHIFT REGISTER CIRCUIT

(75) Inventor: Youichi Tobita, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 291 days.

(21) Appl. No.: 12/647,108

(22) Filed: Dec. 24, 2009

(65) Prior Publication Data

US 2010/0166136 A1     Jul. 1, 2010

(30) Foreign Application Priority Data

Dec. 25, 2008    (JP) ................. 2008-329104

(51) Int. Cl.
*G11C 19/00*    (2006.01)
(52) U.S. Cl. .......................... 377/67; 377/64
(58) Field of Classification Search .......... 377/64, 377/67
See application file for complete search history.

(56) References Cited

U.S. PATENT DOCUMENTS

| | | |
|---|---|---|
| 3,480,796 A | 11/1969 | Polkinghorn et al. |
| 3,506,851 A | 4/1970 | Polkinghorn et al. |
| 3,564,290 A | 2/1971 | Sonoda |
| 3,710,271 A | 1/1973 | Putnam |
| 3,774,055 A | 11/1973 | Bapat |
| 3,898,479 A | 8/1975 | Proebsting |
| 3,937,983 A | 2/1976 | Reed |
| 4,061,933 A | 12/1977 | Schroeder et al. |
| 4,122,361 A | 10/1978 | Clemen et al. |
| 4,239,990 A | 12/1980 | Hong et al. |
| 4,239,991 A | 12/1980 | Hong et al. |
| 4,276,487 A | 6/1981 | Arzubi et al. |
| 4,379,974 A | 4/1983 | Plachno |
| 4,443,714 A | 4/1984 | Nakano et al. |
| 4,447,745 A | 5/1984 | Takemae et al. |
| 4,633,105 A | 12/1986 | Tsujimoto |
| 6,064,713 A * | 5/2000 | Lebrun et al. .................. 377/67 |
| 7,116,748 B2 | 10/2006 | Nagao et al. |
| 7,372,300 B2 | 5/2008 | Tobita |
| 7,406,147 B2 * | 7/2008 | Lo et al. ........................ 377/64 |

(Continued)

FOREIGN PATENT DOCUMENTS

JP    2004-78172    3/2004

OTHER PUBLICATIONS

U.S. Appl. No. 13/270,998, filed Oct. 11, 2011, Tobita.

(Continued)

*Primary Examiner* — Ryan Jager
(74) *Attorney, Agent, or Firm* — Oblon, Spivak, McClelland, Maier & Neustadt, L.L.P.

(57) ABSTRACT

A shift register circuit is provided that can decrease a power consumption caused by a clock signal and can achieve a high driving capacity. A unit shift register has a first transistor that activates an output signal when a power supply potential is provided to an output terminal. A pull-up driving circuit for driving the first transistor has a second transistor for providing a clock signal to a node connected to the gate of the first transistor and a boosting circuit for the node. When an output signal of a preceding stage is activated, the second transistor turns on. Thereafter, when the clock signal is activated, and the node is charged, the second transistor turns off. The boosting circuit increases the potential at the node when the second transistor turns off. Therefore, the first transistor can operate in non-saturation region and activate the output signal.

12 Claims, 19 Drawing Sheets

U.S. PATENT DOCUMENTS

| | | | |
|---|---|---|---|
| 7,436,923 | B2 | 10/2008 | Tobita |
| 7,443,944 | B2 | 10/2008 | Tobita et al. |
| 7,447,292 | B2 * | 11/2008 | Hsu et al. ............... 377/64 |
| 7,492,853 | B2 | 2/2009 | Tobita |
| 7,664,218 | B2 | 2/2010 | Tobita |
| 7,696,974 | B2 * | 4/2010 | Moon et al. ............ 345/100 |
| 7,889,832 | B2 * | 2/2011 | Otose et al. ............ 377/67 |
| 2003/0231735 | A1 | 12/2003 | Moon et al. |
| 2005/0083292 | A1 | 4/2005 | Moon et al. |
| 2007/0195053 | A1 | 8/2007 | Tobita et al. |
| 2007/0195920 | A1 | 8/2007 | Tobita |
| 2009/0251443 | A1 * | 10/2009 | Jinta ............... 345/204 |
| 2010/0214206 | A1 * | 8/2010 | Yokoyama et al. ......... 345/100 |
| 2010/0259525 | A1 * | 10/2010 | Ohkawa et al. ........... 345/211 |

OTHER PUBLICATIONS

U.S. Appl. No. 12/606,551, filed Oct. 27, 2009, Tobita.

* cited by examiner

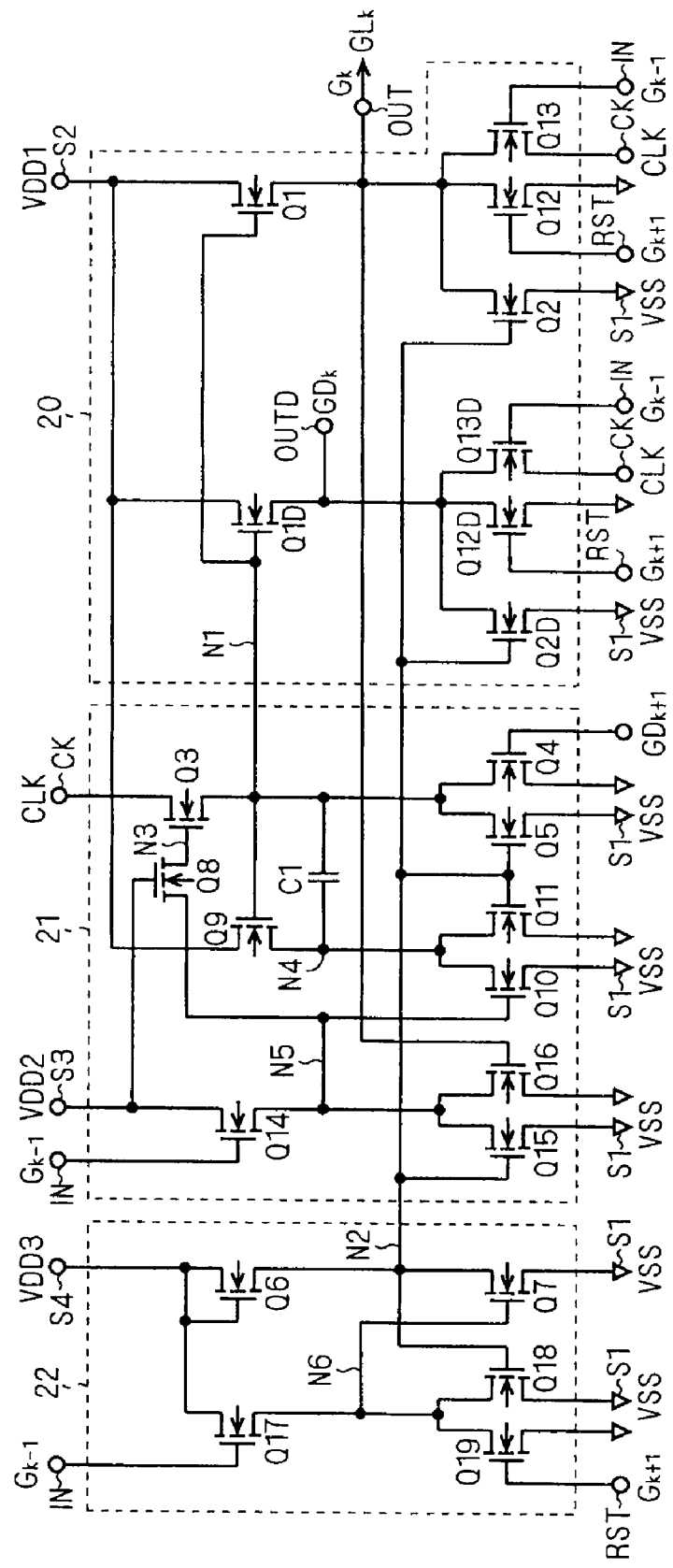
F I G . 8

SHIFT REGISTER CIRCUIT

BACKGROUND OF THE INVENTION

1. Field of the Invention

The present invention relates to a scanning line driving circuit, and more particularly to a shift register circuit applicable to a scanning line driving circuit for use as, e.g., an electro-optic apparatus such as an image display apparatus and an image sensor and constituted by only field-effect transistors of the same conductivity type.

2. Description of the Background Art

In an image display apparatus (hereinafter referred to as a "display apparatus") such as a liquid crystal display apparatus, a plurality of pixels are arranged in a matrix on a display panel, and a gate line (scanning line) is provided for each row of pixels (pixel line) of the display panel. In a cycle of one horizontal period of a display signal, the gate lines are sequentially selected and driven to update a display image. As a gate line driving circuit (scanning line driving circuit) for sequentially selecting and driving pixel lines, i.e., gate lines, a shift register may be used, which performs a round of shift operation in one frame period of a display signal.

In order to reduce the number of steps in the manufacturing process of a display apparatus, a shift register for use as a gate line driving circuit should preferably be constituted by only field-effect transistors of the same conductivity type. Therefore, various types of shift registers constituted by only N- or P-type field-effect transistors, and various display apparatuses containing such shift registers have been proposed (e.g., in Japanese Patent Application Laid-open No. 2004-78172).

A shift register for use as a gate line driving circuit is constituted by a plurality of cascade-connected shift register circuits, each of which is provided for each pixel line, i.e., each gate line. In this specification, for convenience of description, each of a plurality of shift register circuits forming a gate line driving circuit is referred to as a "unit shift register." In other words, an output terminal of each unit shift register constituting a gate line driving circuit is connected to an input terminal of a unit shift register of a subsequent stage or a later stage.

FIG. 7 of Japanese Patent Application Laid-open No. 2004-78172 illustrates a configuration of a conventional unit shift register. As shown in FIG. 7 thereof, the conventional unit shift register includes a first transistor (M1) connected between an output terminal of an output signal (GOUT[N]) and a clock terminal provided with a clock signal (CKV) and a second transistor (M2) connected between the output terminal and a first power supply terminal (VOFF). The unit shift register outputs the output signal (GOUT[N]), when the clock signal (CKV) is transmitted to the output terminal through the first transistor (M1) while the first transistor (M1) is on and the second transistor (M2) is off.

In particular, it is necessary for a gate line driving circuit to activate a gate line by charging it rapidly using the output signal, and accordingly, in each unit shift register constituting the gate line driving circuit, the first transistor (M1) is required to have a high drive capability (a capability to pass current). Therefore, a gate width (channel width) of the first transistor (M1) is configured to be wide.

A first node (N1), to which the gate of the first transistor (M1) is connected, is connected to a third transistor (M4) for discharging the first node (N1) in a period in which the output signal (GOUT[N]) is a non-active level (non-selection period). The third transistor (M4) is connected between the first node (N1) and the first power supply terminal (VOFF). The unit shift register has an inverter (M6, M7) whose input end is the first node (N1), and the gate of the third transistor (M4) is connected to a second node (N2), i.e., an output end of the inverter.

The unit shift register is configured to maintain the second node (N2) at the H level in the non-selection period. Therefore, in the non-selection period, the third transistor (M4) is in the on-state, and the first node (N1) is maintained at the L level in a low impedance. Accordingly, the first transistor (M1) is maintained in the off-state. Since the second transistor (M2) is turned into the on-state, the output terminal (GOUT[N]) is fixed to the L level.

In a generally-used gate-insulated field-effect transistor, a drain (source) electrode and a gate electrode are arranged to overlap with each other in a certain area so as to allow connection between the drain electrode and the source electrode via a conductive channel. Therefore, there is a capacitive component called an overlap capacitance between the drain and the gate (source). Especially, thin film transistors using amorphous silicon tend to have a large overlap capacitance, which, in some cases, amounts to about the same as a capacitance between the gate and the channel.

In the above unit shift register, in the non-selection period, the first transistor (M1) is in the off-state, but the clock signal (CKV) is continuously provided to the drain thereof (clock terminal). Therefore, when the clock signal (CKV) rises (changes from the L level to the H level), the potential at the first node (N1) increases due to the coupling via the overlap capacitance. Since the third transistor (M4) is turned off at this moment, the first node (N1) instantly gets back to the L level, and the first transistor (M1) is maintained in the off-state, which prevents the unit shift register from malfunctioning.

However, a current (capacitive coupling current) flows from this clock terminal to the first power supply terminal (VOFF) through the overlap capacitance of the transistor Q1, the first node (N1), and the third transistor (M4). This current is not so much large in one unit shift register, but the gate line driving circuit has many unit shift registers to which the same clock signal is provided. Therefore, the current is considered to be rather large in terms of the gate line driving circuit.

In other words, the capacitive coupling current increases in proportion to the number of stages of shift registers, i.e., the number of gate lines, in the gate line driving circuit. Therefore, when a display apparatus has a large display area with many lines of pixels, a correspondingly large capacitive coupling current flows. As a result, there arises a problem in that a power consumption places a restriction on enlargement of a display area (achieving a large screen).

In the unit shift register of FIG. 7 of Japanese Patent Application Laid-Open No. 2004-78172, this problem may be solved by a method of reducing the overlap capacitance by reducing the gate width of the first transistor (M1). However, as described above, the first transistor (M1) is required to have a high driving capacity, and therefore, it is not preferable to narrow the gate width.

SUMMARY OF THE INVENTION

It is the object of the present invention to provide a shift register circuit that achieves a low power consumption in a clock signal and a high driving capacity.

A shift register circuit according to the first aspect of the present invention includes an input terminal, an output terminal, a clock terminal, a first transistor for charging the output terminal by providing a constant first power supply potential to the output terminal, a second transistor for discharging the output terminal, a pull-up driving circuit for driving the first transistor, and a pull-down driving circuit for driving the second transistor. The pull-up driving circuit includes a third transistor for providing a clock signal provided at the clock terminal to the first node connected to a control electrode of the first transistor and a boosting circuit for increasing a potential at the first node. A control electrode of the third transistor is charged when an input signal input to the input terminal is activated, and the control electrode of the third transistor is discharged when the first node is charged by activation of the clock signal. The pull-down driving circuit discharges a control electrode of the second transistor before the charging of said first node by activation of the clock signal begins. The boosting circuit increases the potential at the first node after the control electrode of the third transistor is discharged.

A shift register circuit according to the second aspect of the present invention includes an input terminal, an output terminal, a clock terminal, a first transistor for charging the output terminal by providing a constant first power supply potential to the output terminal, and a pull-up driving circuit for driving the first transistor. The pull-up driving circuit includes a second transistor for charging a first node by providing a second power supply potential larger in absolute value than the first power supply potential to the first node connected to a control electrode of the first transistor, a third transistor for providing a clock signal provided at the clock terminal to a second node connected to a control node of the second transistor, and a boosting circuit for boosting the second node. A control electrode of the third transistor is charged when an input signal input to the input terminal is activated, and the control electrode of the third transistor is discharged when the second node is charged by activation of the clock signal. The boosting circuit increases the potential at the second node after the control electrode of the third transistor is discharged.

The shift register circuit according to the present invention does not supply the clock signal to the first transistor charging the output terminal. A transistor having a large gate width (large overlap capacitance) is used as the first transistor in order to improve the driving capacity of the shift register circuit. In contrast, in a conventional shift register circuit, this first transistor is provided with the clock signal, which causes a capacitive coupling current to flow through an overlap capacitance. This is one of the reasons that increase power consumption. The shift register circuit according to the present invention does not provide the clock signal to the first transistor, thus consuming less power than the conventional shift register circuit.

These and other objects, features, aspects and advantages of the present invention will become more apparent from the following detailed description of the present invention when taken in conjunction with the accompanying drawings.

BRIEF DESCRIPTION OF THE DRAWINGS

FIG. 8 is a circuit diagram showing the unit shift register according to the fifth variation of the first embodiment;

DESCRIPTION OF THE PREFERRED EMBODIMENTS

Figure 1:
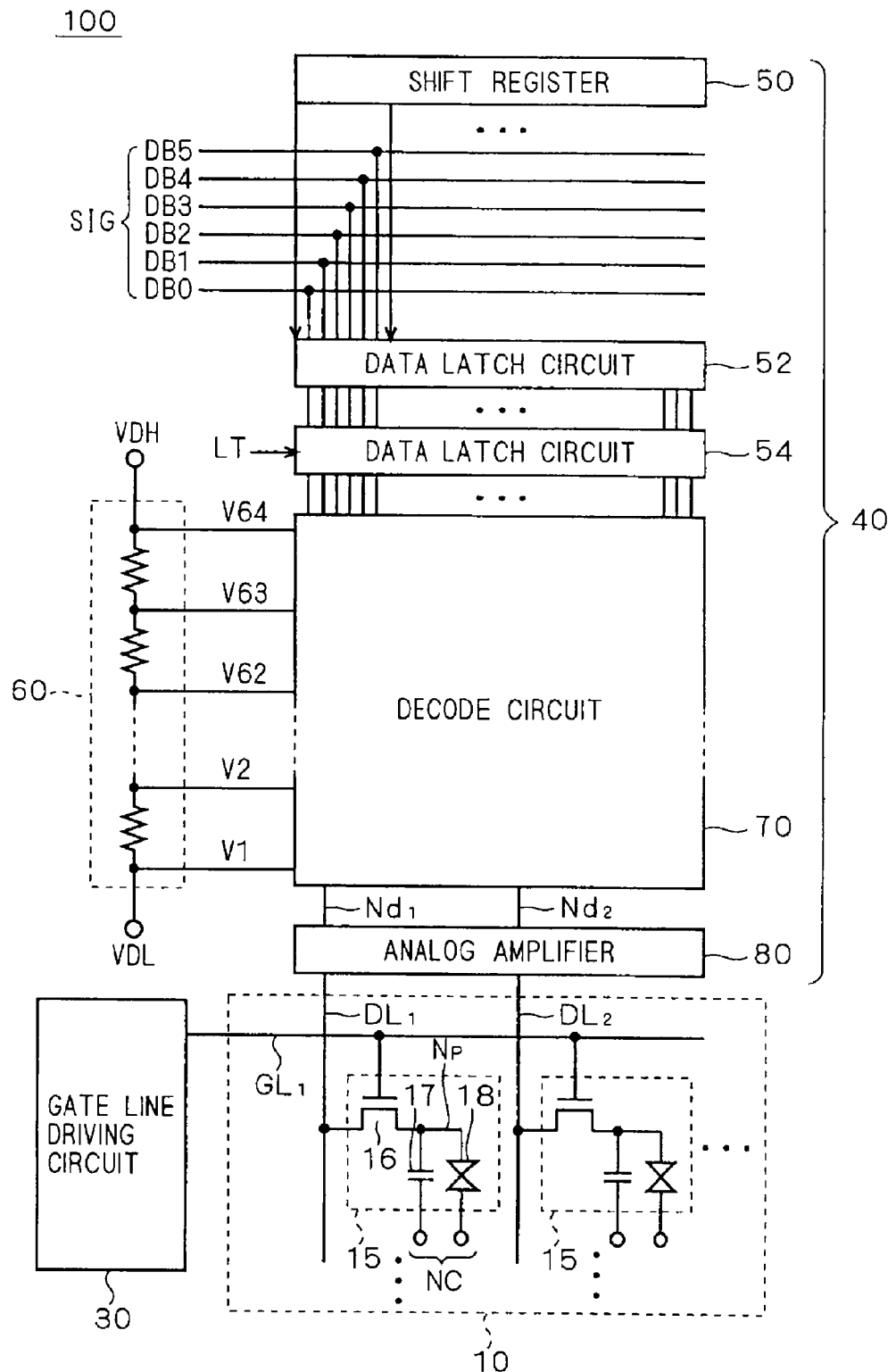
FIG. 1 is a schematic block diagram showing a configuration of a liquid crystal display apparatus.

The embodiments of the present invention will be hereinafter described with reference to the drawings. To avoid repetition and redundancy of description, elements having the same or equivalent functions are designated by the same reference numerals or characters in the drawings.

Transistors used in the embodiments are insulated-gate field effect transistors. In the insulated-gate field effect transistor, an electric field in a gate insulator film controls an electrical conductivity between a drain region and a source region in a semiconductor layer. Polysilicon, amorphous silicon, organic semiconductor such as pentacene, monocrystal silicon and oxide semiconductor such as IGZO (In—Ga—Zn—O) can be used as materials of the semiconductor layer formed with the drain region and the source region.

As is well-known, a transistor is a device having at least three electrodes, i.e., a control electrode (in a more limited sense, a gate (electrode)), one current electrode (in a more limited sense, a drain (electrode) or a source (electrode)), and the other current electrode (in a more limited sense, a source (electrode) or a drain (electrode)). A transistor serves as a switching device in which a channel is formed between the drain and the source when a predetermined voltage is applied to the gate. The drain and the source of the transistor have basically the same structure, and their names are switched in accordance with the condition of the applied voltage. For example, in an N-type transistor, an electrode having a relatively high potential (hereinafter also referred to as "level") is called a drain, and an electrode having a relatively low potential is called a source (which are opposite in a P-type transistor).

Unless specifically stated, such transistor may be formed on a semiconductor substrate, and may be a thin-film transistor (TFT) formed on an insulating substrate such as glass. A monocrystal substrate and an insulating substrate such as SOI, glass, and resin may be used as a substrate to be formed with transistors.

A gate line driving circuit according to the present invention is constituted by only transistors of the same conductivity type. For example, an N-type transistor attains an activated state (on state, conducting state) when a voltage between the gate and source attains an H (high) level which is higher than a threshold voltage of the transistor, and the N-type transistor attains a deactivated state (off state, nonconducting (shutoff) state) when the voltage attains an L (low) level which is lower than the threshold voltage. Therefore, in a circuit using N-type transistors, the H level of a signal is "activated level", and the L level is "deactivated level." Further, when each node of the circuit constituted by N-type transistors is charged to be the H level, a change from the deactivated level to the activated level occurs. When each node is discharged to be the L level, a change from the activated level to the deactivated level occurs.

In contrast, a P-type transistor attains an activated state (on state, conducting state) when a voltage between the gate and source attains an L level which is lower than the threshold voltage (a negative value with respect to the source) of the transistor, and the P-type transistor attains a deactivated state (off state, nonconducting state) when the voltage attains an H level which is higher than the threshold voltage. Therefore, in a circuit using P-type transistors, the L level of a signal is "activated level", and the H level is "deactivated level." Further, in each node of the circuit constituted by P-type transistors, a relationship between charge and discharge is opposite to the case of N-type transistors. When each node is charged to be the L level, a change from the deactivated level to the activated level occurs. When each node is discharged to be the H level, a change from the activated level to the deactivated level occurs.

In this specification, a "connection" between two devices, between two nodes, or between one device and one node includes a connection by way of another element (such as a device and a switch), which is a state equivalent to a substantially direct connection. For example, even when two devices are connected via a switch, the two devices are described as being "connected" as long as the two devices can serve as if they are directly connected.

In the present invention, a clock signal having phases different from each other (multiphase clock signal) is used. In the below, for brevity of explanation, a certain interval (a time $t_2$ to a time $t_3$ and a time $t_4$ to a time $t_5$ in FIG. 4) is arranged between an activated period of a clock signal and an activated period of a signal subsequently activated. However, in the present invention, the above interval may not be arranged, as long as activated periods of clock signals do not substantially overlap with each other. For example, where the activated level is the H level, a fall timing of a clock signal may be at the same as a rise timing of another clock signal activated subsequent thereto.

First Embodiment

FIG. 1 is a schematic block diagram showing a configuration of a display apparatus according to the first embodiment of the present invention. In FIG. 1, an entire configuration of a liquid crystal display apparatus 100 is shown as a representative example of the display apparatus. It should be noted that a gate line driving circuit according to the present invention is not limited to application to a liquid crystal display apparatus, and can be widely applied to electro-optic apparatuses such as electroluminescence (EL), organic EL, plasma display, electronic paper, and image sensor.

The liquid crystal display apparatus 100 includes a liquid crystal array unit 10, a gate line driving circuit (scanning line driving circuit) 30, and a source driver 40. As will be clear from the following description, a shift register according to the embodiments of the present invention is arranged in the gate line driving circuit 30.

The liquid crystal array unit 10 includes a plurality of pixels 15 arranged in a matrix. Gate lines $GL_1$, $GL_2$, ... (hereinafter also generically referred to as "gate lines GL") are respectively provided for rows of pixels (hereinafter also referred to as "pixel lines"). Data lines $DL_1$, $DL_2$, ... (hereinafter also generically referred to as "data lines DL") are respectively provided for columns of pixels (hereinafter also referred to as "pixel columns"). FIG. 1 shows, as a representative example, the pixels 15 in the 1st column and the 2nd column of the 1st row and the corresponding gate line $GL_1$ and the corresponding data lines $DL_1$ and $DL_2$.

Each of the pixels 15 has a pixel switch device 16 arranged between a corresponding data line DL and a pixel node Np, and also has a capacitor 17 and a liquid crystal display device 18 connected in parallel between the pixel node Np and a common electrode node NC. The orientation of the liquid crystal in the liquid crystal display device 18 changes in accordance with the voltage difference between the pixel node Np and the common electrode node NC, and the display brightness of the liquid crystal display device 18 changes in accordance therewith. Therefore, the brightness of each of the pixels can be controlled by the display voltage transmitted to the pixel node Np via the data line DL and the pixel switch device 16. Specifically, an intermediate brightness can be obtained by applying, across the pixel node Np and the common electrode node NC, an intermediate voltage difference between a voltage difference for the maximum brightness and a voltage difference for the minimum brightness. Therefore, multiple levels of gradation can be obtained by setting the above display voltage to multiple levels.

The gate line driving circuit 30 sequentially selects and activates the gate lines GL in a predetermined scanning cycle. The gate electrode of each of the pixel switch devices 16 is connected to a corresponding gate line GL. While a certain gate line GL is selected, the pixel switch device 16 becomes conductive in each pixel connected to the selected gate line GL, so that the pixel node Np is in connection to a corresponding data line DL. Then, a display voltage transmitted to the pixel node Np is stored to the capacitor 17. In general, the pixel switch device 16 is a TFT formed on the same insulating substrate (such as a glass substrate and a resin substrate) as that formed with the liquid crystal display device 18.

The source driver 40 is provided to output, to the data lines DL, display voltages which are set to multiple levels by a display signal SIG that is an N-bit digital signal. For example, the display signal SIG is a 6-bit signal including display signals bits DB0 to DB5. With such a 6-bit display signal SIG, $2^6=64$ levels of gradation can be displayed in each pixel. Furthermore, by forming one color display unit using three pixels of R (Red), G (Green), and B (Blue), a display of approximately 260 thousand colors can be achieved.

As shown in FIG. 1, the source driver 40 includes a shift register 50, data latch circuits 52 and 54, a gradation voltage generating circuit 60, a decoder circuit 70, and an analog amplifier 80.

For the display signal SIG, the display signal bits DB0 to DB5 corresponding to the display brightness of each of the pixels 15 are serially generated. In other words, the display signal bits DB0 to DB5 at each point in time indicate the display brightness of any one pixel 15 in the liquid crystal array unit 10.

The shift register 50 instructs the data latch circuit 52 to fetch the display signal bits DB0 to DB5 with timing synchronized with a cycle in which the setting of the display signal SIG is switched. The data latch circuit 52 sequentially fetches the serially-generated display signals SIG to latch display signals SIG of one pixel line.

A latch signal LT input to the data latch circuit 54 is activated at a time at which display signals SIG of one pixel line have been fetched by the data latch circuit 52. In response to this, the data latch circuit 54 fetches display signals SIG of one pixel line latched in the data latch circuit 52 at that time.

The gradation voltage generating circuit 60 is composed of sixty-three dividing resistances which are connected in series between a high voltage VDH and a low voltage VDL and which generate 64 levels of gradation voltages V1 to V64, respectively.

The decoder circuit 70 decodes display signals SIG latched in the data latch circuit 54, and based on the result of decoding, selects voltages from among the gradation voltages V1 to V64 and outputs the voltages to decoder output nodes $Nd_1$, $Nd_2$, . . . (hereinafter also generically referred to as "decoder output nodes Nd").

Consequently, display voltages (any of the gradation voltages V1 to V64) corresponding to display signals SIG of one pixel line latched in the data latch circuit 54 are output to the decoder output nodes Nd simultaneously (in parallel). FIG. 1 shows, as a representative example, the decoder output nodes $Nd_1$ and $Nd_2$ corresponding to the data lines $DL_1$ and $DL_2$ of the first and second columns, respectively.

The analog amplifier 80 current-amplifies analog voltages which correspond to the display voltages output to the decoder output nodes $Nd_1$, $Nd_2$, . . . from the decoder circuit 70, and outputs the amplified analog voltages to the data lines $DL_1$, $DL_2$, . . . , respectively.

The source driver 40 repeatedly outputs, to the data lines DL, display voltages of one pixel line corresponding to a series of display signals SIG in a predetermined scanning cycle, and the gate line driving circuit 30 sequentially drives the gate lines $GL_1$, $GL_2$, . . . in synchronization with that scanning cycle. Accordingly, image display based on the display signals SIG is provided on the liquid crystal array 10.

While FIG. 1 shows, by way of example, the liquid crystal display apparatus 100 with such a configuration that the gate line driving circuit 30 and the source driver 40 are integrally formed with the liquid crystal array unit 10, the gate line driving circuit 30 and the liquid crystal array unit 10 may be integrally formed, and the source driver 40 may be provided as an external circuit of the liquid crystal array unit 10. Alternatively, the gate line driving circuit 30 and the source driver 40 may be provided as external circuits of the liquid crystal array unit 10.

Figure 2:
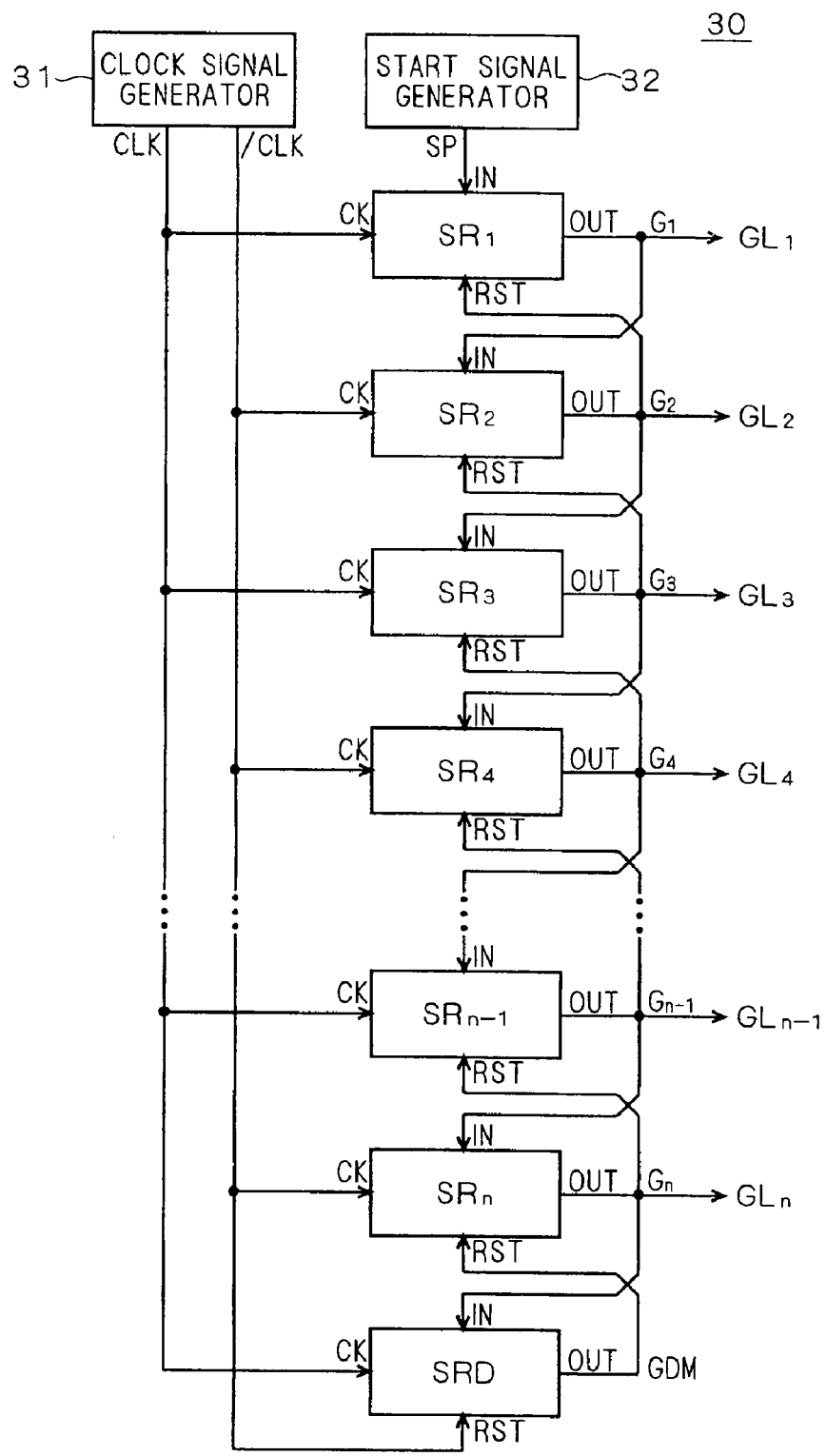
FIG. 2 is a figure showing a configuration of a gate line driving circuit according to the first embodiment.

FIG. 2 shows a configuration of the gate line driving circuit 30. This gate line driving circuit 30 is constituted by a shift register including a plurality of cascade-connected unit shift registers $SR_1$, $SR_0$, $SR_3$, $SR_4$, . . . (hereinafter, the cascade-connected shift register circuits $SR_1$, $SR_0$, . . . are generically referred to as "unit shift registers SR" for convenience of description). Each unit shift register SR is provided for each pixel line, i.e., each gate line GL. An output terminal OUT of each unit shift register SR is connected to a corresponding gate line GL.

The gate line driving circuit 30 according to the embodiments has a dummy unit shift register SRD (hereinafter referred to as "dummy stage"), which is not connected to any gate line, arranged at a stage subsequent to the unit shift register SRn of the last stage. Basically, the dummy stage SRD has the same configuration as the other unit shift registers SR.

A clock generator 31 shown in FIG. 2 is provided to input a two-phase clock including clock signals CLK and /CLK having phases opposite to each other (not causing activated periods to be overlapped) to the unit shift registers SR in the gate line driving circuit 30. These clock signals CLK and /CLK have phases opposite to each other and are controlled to be activated alternately with timing synchronized with a scanning cycle of the display apparatus.

Each unit shift register SR has an input terminal IN, an output terminal OUT, a clock terminal CK, and a reset terminal RST. As shown in FIG. 2, either of the clock signals CLK and /CLK is supplied to the clock terminal CK of each unit shift register SR. Specifically, the clock signal CLK is provided to unit shift registers of odd-number stages $SR_1$, $SR_3$, $SR_5$, . . . , and the clock signal /CLK is provided to unit shift registers of even-number stages $SR_2$, $SR_4$, $SR_6$, . . . .

In the example of FIG. 2, the unit shift register $SR_n$ of the $n^{th}$ stage, i.e., the last stage, is an even-number stage, and the clock signal /CLK is provided to the unit shift register $SR_n$. Therefore, the dummy stage SRD is an odd-number stage, and the clock signal CLK is provided to the clock terminal CK of the dummy stage SRD.

A start pulse SP for causing the gate line driving circuit 30 to start shift operation on a signal is input to the input terminal IN of the unit shift register $SR_1$ of the first stage. The start pulse SP is generated by a start signal generation device 32. In the present embodiment, the start pulse SP is a signal activated (attaining the H level) at a time corresponding to the start of each frame period of an image signal. The input terminal IN of a unit shift register SR of the second or subsequent stage is connected to the output terminal OUT of the unit shift register SR of the preceding stage.

The reset terminal RST of each unit shift register SR is connected to the output terminal OUT of the unit shift register SR of a succeeding stage. The reset terminal RST of the unit shift register $SR_n$ of the last stage is connected to the output terminal OUT of the dummy stage SRD. It should be noted that the clock signal /CLK having a phase different from that of the clock signal CLK input to the clock terminal CK of the dummy stage SRD is input to the reset terminal RST of the dummy stage SRD.

As described above, the output signal G output from the output terminal OUT of each unit shift register SR is provided as a vertical (or horizontal) scanning pulse to the corresponding gate line GL, and is also provided to the input terminal IN of a stage subsequent to the unit shift register SR and the reset terminal RST of a stage preceding the unit shift register SR.

In the gate line driving circuit 30, in synchronization with the clock signal CLK or /CLK, each unit shift register SR time-shifts a signal input to the input terminal IN (i.e., the start pulse SP or the output signal G from a stage preceding the unit shift register SR), and transmits the time-shifted signal to a corresponding gate line GL and to a unit shift register SR of a stage subsequent to the unit shift register SR while time-shifting the input signal. As a result, the output signal of each unit shift register is activated in the order of $G_1$, $G_2$, $G_3$, . . . (the operation of each unit shift register SR will be described later in detail). Therefore, a series of unit shift registers SR serves as a so-called gate line driving unit for sequentially activating the gate lines GL with timing based on the predetermined scanning cycle.

Figure 3:
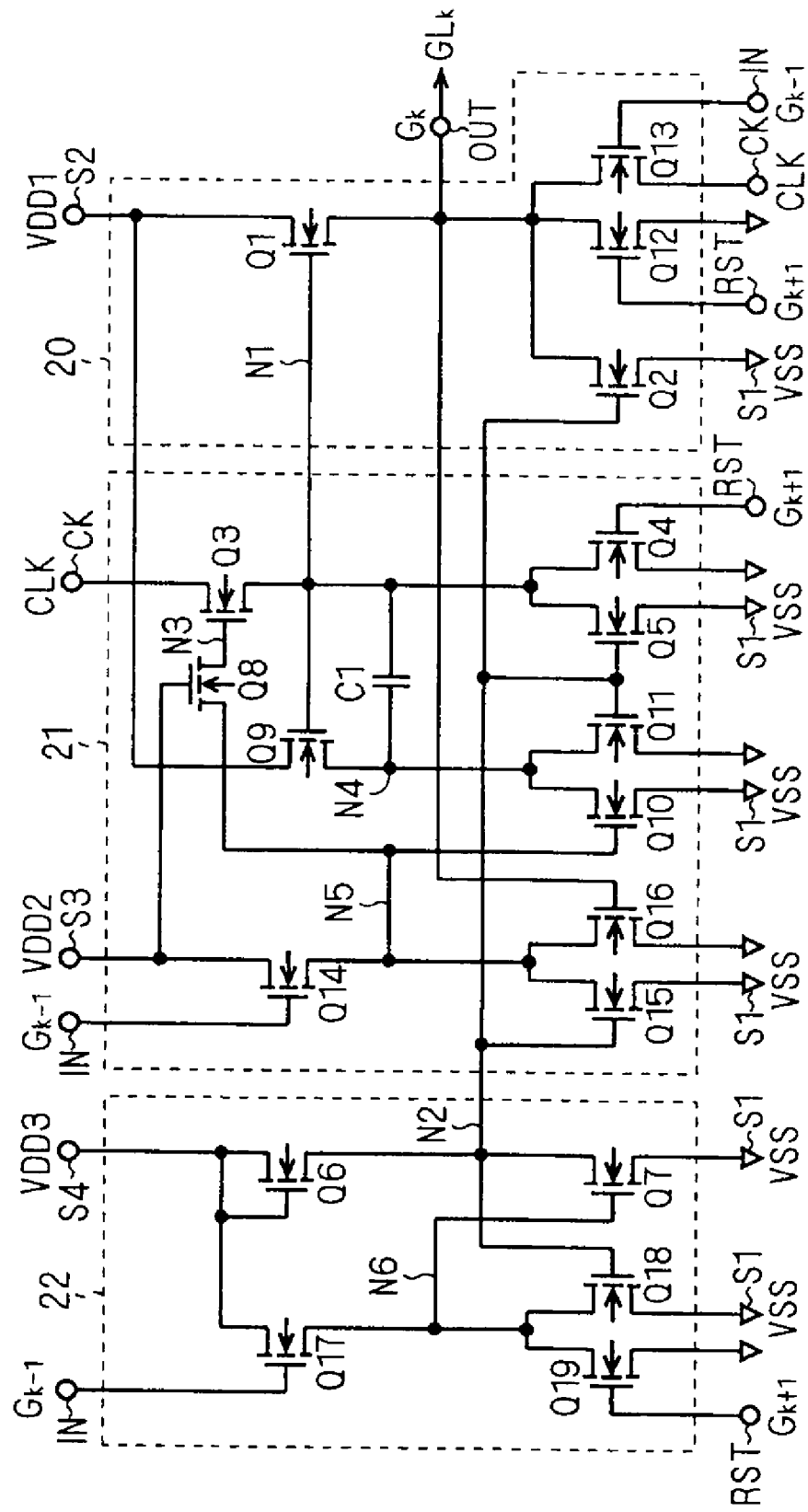
FIG. 3 is a circuit diagram showing a unit shift register according to the first embodiment.

FIG. 3 is a circuit diagram showing a configuration of a unit shift register SR according to the first embodiment of the present invention. Transistors constituting the unit shift register SR according to the present embodiment are all field-effect transistors of the same conductivity type. In the following embodiments and variations, all of the transistors are assumed to be N-type TFTs.

In the gate line driving circuit 30, the cascade-connected unit shift registers SR have substantially the same configuration. In this explanation, the unit shift register $SR_k$ of the $k^{th}$ stage will be explained as a representative example. It is assumed that the clock signal CLK is input to the clock terminal CK of the unit shift register $SR_k$ (This corresponds to odd-number stages of FIG. 2).

As shown in FIG. 3, the unit shift register $SR_k$ has a first power supply terminal S1 supplied with a low power supply potential VSS and second, third and fourth power supply terminals S2, S3 and S4 supplied with high power supply potentials VDD1, VDD2 and VDD3, respectively, in addition to the input terminal IN, the output terminal OUT, the clock terminal CK, and the reset terminal RST which are already shown in FIG. 2. All of the high power supply potentials VDD1, VDD2 and VDD3 may be the same level. In the following description, the low power supply potential VSS shall be a reference potential (=0V) of the circuit; however, in practical use, a reference potential is determined with reference to a voltage of data written into pixels, in which case, for example, the high power supply potentials VDD1, VDD2 and VDD3 may be set as 17V, and the low power supply potential VSS may be set as −12V.

The unit shift register $SR_k$ has an output circuit 20, a pull-up driving circuit 21, and a pull-down driving circuit 22. The output circuit 20 activates and deactivates an output signal $G_k$, and includes transistors Q1, Q2, Q12 and Q13 as described below.

The transistor Q1 is connected between the output terminal OUT and the second power supply terminal S2, and charges the output terminal OUT by providing the potential VDD1 to the output terminal OUT. The transistor Q2 is connected between the output terminal OUT and the first power supply terminal S1, and discharges the output terminal OUT by providing the potential VSS to the output terminal OUT. Herein, a node connected to the gate (control electrode) of the transistor Q1 is defined as "node N1", and a node connected to the gate of the transistor Q2 is defined as "node N2." The node N1 serves as an output end of the pull-up driving circuit 21, and the node N2 serves as an output end of the pull-down driving circuit 22, as specifically described below.

The transistor Q12 is connected between the output terminal OUT and the first power supply terminal S1 in the same manner as the transistor Q2, but the gate (control electrode) of the transistor Q12 is connected to the reset terminal RST. In other words, the transistor Q12 discharges the output terminal OUT in accordance with activation of the output signal $G_{k+1}$ of the subsequent stage (in the unit shift register $SR_n$ of the final stage, the output signal GDM of the dummy stage SRD), i.e., the reset signal provided to the reset terminal RST. The transistor Q13 has the gate connected to the input terminal IN, and is connected between the output terminal OUT and the clock terminal CK. In other words, the transistor Q13 provides to the output terminal OUT the clock signal CLK (in odd number stages, the clock signal /CLK) input to the clock terminal CK, in accordance with activation of an input signal provided to the input terminal IN, i.e., the output signal $G_{k−1}$ of the preceding stage (in the unit shift register $SR_1$ of the first stage, the start pulse SP).

The pull-up driving circuit 21 is adapted to drive the transistor Q1 (output pull-up transistor), and the output end of the pull-up driving circuit 21 is connected to the gate of the transistor Q1 (node N1). The pull-up driving circuit 21 operates to turn on the transistor Q1 during the selection period of the gate line $GL_k$ and turns off the transistor Q1 during the non-selection period of the gate line $GL_k$. Therefore, the pull-up driving circuit 21 charges the node N1 (the gate of the transistor Q1) in accordance with activation of the output signal $G_{k−1}$ of the preceding stage input to the input terminal IN, and discharges the node N1 in accordance with activation of an output signal $G_{k+1}$ of the subsequent stage input to the reset terminal RST.

The pull-up driving circuit 21 includes transistors Q3 to Q5, Q8 to Q11, and Q14 to Q16 as described below. The transistor Q3 is connected between the node N1 and the clock terminal CK, and provides to the node N1 the clock signal CLK input to the clock terminal CK. A node connected to the gate of the transistor Q3 is connected is defined as "node N3."

Each of the transistors Q4 and Q5 is connected between the node N1 and the first power supply terminal S1, and discharges the node N1. The gate of the transistor Q4 is connected to the reset terminal RST, and the gate of the transistor Q5 is connected to the node N2.

The transistors Q9 and Q10 are connected in series between the second power supply terminal S2 and the first power supply terminal S1. A connection node between the transistors Q9 and Q10 is defined as "node N4." The transistor Q9 is connected between the second power supply terminal S2 and the node N4, and the gate of the transistor Q9 is connected to the node N1. The transistor Q10 is connected between the node N4 and the first power supply terminal S1. A node connected to the gate of the transistor Q10 is defined as "node N5." The transistor Q11 is connected between the node N4 and the first power supply terminal S1, and the gate of the transistor Q11 is connected to the node N2.

The transistor Q10 is configured to have a sufficiently small on-state resistance (have a larger driving capacity) than the transistor Q9. The transistors Q9 and Q10 constitute a ratio inverter whose input end is the node N5 and whose output end is the node N4. In the inverter, the transistor Q9 serves as a load element, and the transistor Q10 serves as a driving element. However, it should be noted that the transistors Q9 and Q10 can actually serve as the inverter only while the node N1 is at the H level (corresponding to the activated period of the output signal $G_k$). In a period other than the above, the transistor Q11 turns on, and accordingly, the level of the node N4 is fixed to the L level.

A capacitive element C1 is connected between the node N1 and the node N4 (between the gate and source of the transistor Q9). The capacitive element C1 is provided to capacitively couple the nodes N1 and N4, and serves to increase the potential at the node N1 in accordance with the increase of the level at the node N4.

The transistor Q14 is connected between the node N5 and the third power supply terminal S3, and the gate of the transistor Q14 is connected to the input terminal IN. In other words, the transistor Q14 charges the node N5 in accordance with activation of the output signal $G_{k−1}$ of the preceding stage (input signal). The drain of the transistor Q14 may be connected to the input terminal IN instead of the third power supply terminal S3 (in other words, the transistor Q14 may be diode-connected between the input terminal IN and the node N5).

The transistors Q15 and Q16 for discharging the node N5 may be connected between the node N5 and the first power supply terminal S1. The gate of the transistor Q15 is connected to the node N2, and the gate of the transistor Q16 is connected to the output terminal OUT.

The transistor Q8 is connected between the node N3 and the node N5, and the gate of the transistor Q8 is connected to the third power supply terminal S3. The gate potential of the transistor Q8 is fixed to a constant level, but the transistor Q8 turns on and off in accordance with potential change of the nodes N3 and N5. Accordingly, the node N3 is charged and discharged (the details will be explained later).

On the other hand, the pull-down driving circuit 22 is adapted to drive the transistor Q2 (output pull-down transistor), and the output end thereof is connected to the gate of the transistor Q2 (node N2). The pull-down driving circuit 22 turns off the transistor Q2 during the selection period of the gate line $GL_k$, and turns on the transistor Q2 during the non-selection period thereof. The pull-down driving circuit 22 discharges the node N2 in accordance with the output signal $G_{k-1}$ of the preceding stage (input signal), and charges the node N2 in accordance with the output signal $G_{k+1}$ of the subsequent stage (reset signal).

As descried above, the node N2 is connected to the gates of the transistors Q5, Q11 and Q15 of the pull-up driving circuit 21. The pull-down driving circuit 22 is also used to drive the transistors Q5, Q11 and Q15.

The pull-down driving circuit 22 includes transistors Q6, Q7, and Q17 to Q19 as described below. The transistor Q6 is connected between the node N2 and the fourth power supply terminal S4, and the gate of the transistor Q6 is connected to the fourth power supply terminal S4 (in other words, the transistor Q6 is diode-connected). The transistor Q7 is connected between the node N2 and the first power supply terminal S1. A node connected to the gate of the transistor Q7 is defined as "node N6."

The transistor Q7 is configured to have a sufficiently small on-state resistance (have a larger driving capacity) than the transistor Q6. Therefore, when the potential at the node N6 increases, the potential at the node N2 decreases. When the potential at the node N6 decreases, the potential at the node N2 increases. In other words, the transistors Q6 and Q7 constitute a ratio inverter whose input end is the node N6 and whose output end is the node N2. In the inverter, the transistor Q6 serves as a load element, and the transistor Q7 serves as a driving element.

The transistor Q17 is connected between the node N6 and the fourth power supply terminal S4, and the gate of the transistor Q17 is connected to the input terminal IN. The transistors Q18 and Q19 are connected between the node N6 and the first power supply terminal S1, and the transistors Q18 and Q19 discharge the node N6. The gate of the transistor Q18 is connected to the node N2, and the gate of the transistor Q19 is connected to the reset terminal RST.

Hereinafter, specific operation of the unit shift register SR according to the present embodiment will be described. Each of the unit shift registers SR and the dummy stage SRD constituting the gate line driving circuit 30 operate substantially in the same manner. Herein, operation of the unit shift register $SR_k$ of the $k^{th}$ stage will be also explained as a representative example. The unit shift register $SR_k$ is assumed to have the clock signal CLK input to the clock terminal CK (this corresponds to the unit shift registers of odd-number stages).

Unless specifically stated, in the below explanation, all of the clock signals CLK and /CLK and the start pulse SP are assumed to have the same potential at the H level, and the level thereof is assumed to be VDD, for brevity of explanation. Furthermore, VDD is assumed to be the same as the levels of the high power supply potentials VDD1 to VDD3 (i.e., VDD1=VDD2=VDD3=VDD). At the L level, the clock signals CLK and /CLK and the start pulse SP is assumed to have the same potential as the low power supply potential VSS, and the potential thereof is assumed to be 0V (VSS=0). Furthermore, the threshold voltages of the transistors are all assumed to be the same, and the value thereof is assumed to be Vth. It should be noted that the clock signals CLK and /CLK are repeating signals having a phase difference of one horizontal period (1H) from each other (see FIG. 4).

Figure 4:
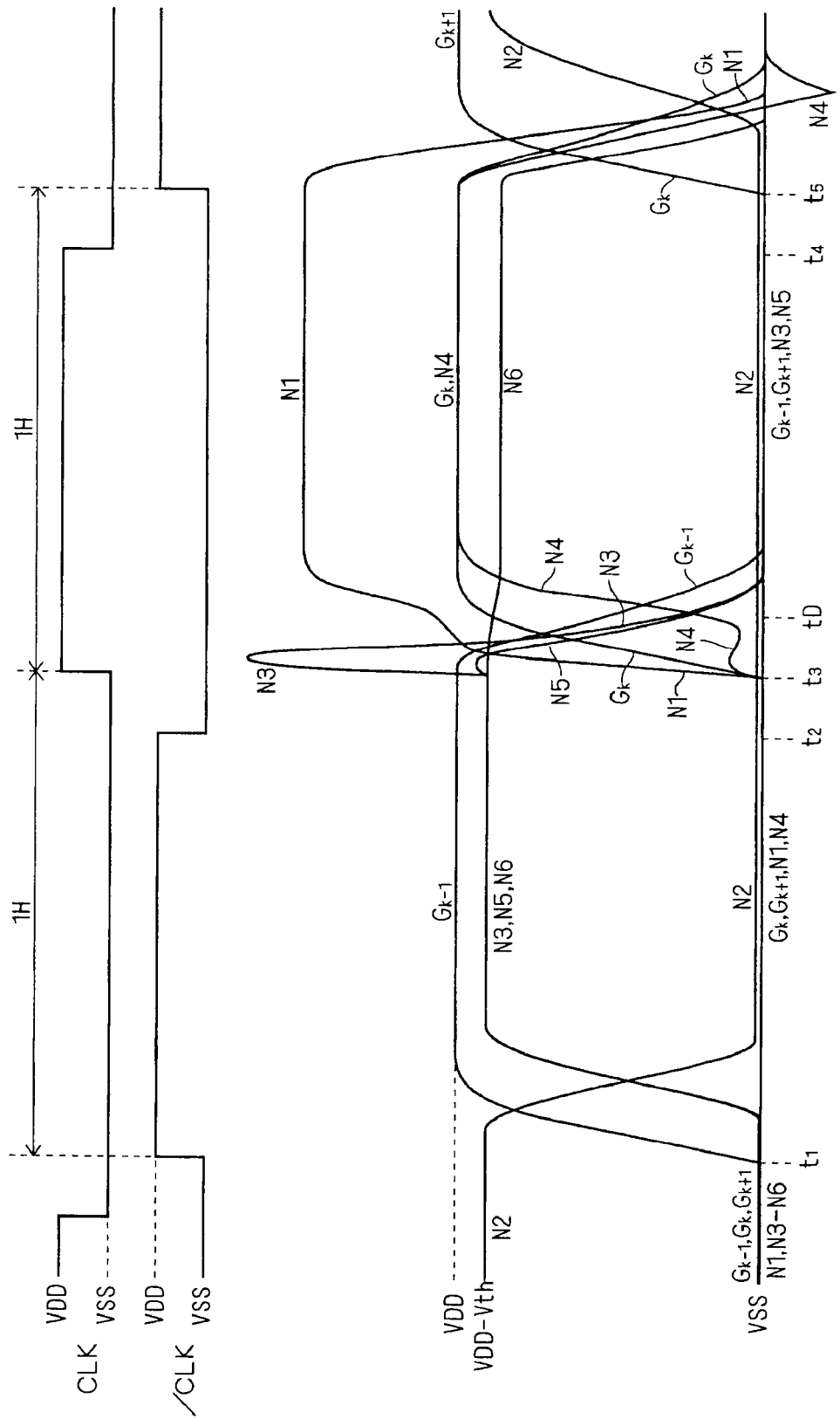
FIG. 4 is a timing chart illustrating operation of the unit shift register according to the first embodiment.

FIG. 4 is a timing chart for illustrating the operation of the unit shift register according to the first embodiment. The operation of the unit shift register $SR_k$ will be explained with reference to FIG. 4.

The initial state of the unit shift register $SR_k$ immediately before a time $t_1$ is assumed to be such that the node N1 is at the L level (VSS) and the node N2 is at the H level (VDD−Vth) (hereinafter, this state is referred to as "reset state"). In this reset state, the transistor Q1 is off, and the transistor Q2 is on, and therefore, the output terminal OUT (output signal $G_k$) is maintained at the L level. In other words, the gate line $GL_k$ connected to this unit shift register $SR_k$ is in the non-selection state.

At a time immediately before the time $t_1$, all of the clock terminal CK (the clock signal CLK) of the unit shift register $SR_k$, the reset terminal RST (the output signal $G_{k+1}$ of the subsequent stage), and the input terminal IN (the output signal $G_{k-1}$ of the preceding stage) are assumed to be at the L level. Therefore, the transistors Q4, Q12 to Q14, Q17 and Q19 are in off-state. On the other hand, since the node N2 is at the H level, the transistors Q11, Q15 and Q18 are in on-state. Accordingly, the nodes N4, N5 and N6 are at the L level (VSS). Further, the node N3 is at the L level (VSS) because the transistor Q8 is in on-state when the node N5 is at the L level. Therefore, the transistor Q3 is in off-state.

Under the above-described state, it is assumed that, at the time $t_1$, the clock signal /CLK rises and that the output signal $G_{k-1}$ of the preceding stage is activated.

In the pull-down driving circuit 22, when the level of the output signal $G_{k-1}$ of the preceding stage increases, the transistor Q17 turns on. At this moment, the transistor Q18 is also on, but the transistor Q17 is configured to have a sufficiently lower on-state resistance than the transistor Q18, and therefore, the level of the node N6 increases. Accordingly, the transistor Q7 turns on, and the node N2 attains the L level, which causes the transistor Q18 to turn off, and the node N6 attains the H level of the potential VDD−Vth.

On the other hand, in the pull-up driving circuit 21, when the level of the output signal $G_{k-1}$ of the preceding stage increases, the transistor Q14 turns on. At this moment, the output signal $G_k$ is at the L level, and therefore, the transistor Q16 is in off-state. Further, the above operation of the pull-down driving circuit 22 changes the node N2 to the L level, which causes the transistor Q15 to turn off. Therefore, the node N5 is charged by the transistor Q14, and attains the H level of the potential VDD−Vth.

When the level of the node N5 increases, a current flows into the node N3 through the transistor Q8 in on-state. The gate of the transistor Q8 has the potential VDD, and accordingly, the node N3 has the same potential, i.e., VDD−Vth, as the node N5.

When the node N2 attains the L level, the transistor Q5 turns off. At substantially the same time, the node N3 attains the H level. Accordingly, the transistor Q3 to on-state, and the clock signal CLK of the L level (VSS) is provided to the node N1. Therefore, the node N1 is maintained at the L level. Similarly, when the node N2 attains the L level, the transistor Q11 also turns off. At substantially the same time, the node N5 attains the H level, and the transistor Q10 turns on. Therefore, the node N4 is maintained at the L level.

In the output circuit 20, the transistor Q13 turns on in accordance with activation of the output signal $G_{k-1}$ of the preceding stage, and the clock signal CLK of the L level (VSS) is provided to the output terminal OUT. Therefore, even when the above operation of the pull-down driving circuit 22 changes the node N2 to the L level to cause the transistor Q2 to turn off, the output signal $G_k$ is maintained at the L level in a low impedance.

Thereafter, the clock signal /CLK falls at the time $t_2$, the output signal $G_{k-1}$ of the preceding stage is maintained at the H level (the details will be explained later). At the time $t_2$, the level of each node of the unit shift register $SR_k$ does not change.

When the clock signal CLK rises at the time $t_3$, the node N1 is charged by the transistor Q3 in on-state. When the level of the node N1 increases, the potential at the node N3 increases due to the coupling via the capacitance between the gate and channel of the transistor Q3. At this moment, the transistor Q8 turns off, and accordingly, the potential at the node N3 increases to such a level that allows the transistor Q3 to operate in a non-saturated region. Therefore, the node N1 is rapidly charged (pre-charged), and attains the H level of the potential VDD which is the same as that of the clock signal CLK. The above state, in which the node N1 is at the H level and the node N2 is at the L level, is referred to as "set state" of the unit shift register $SR_k$.

In the set state, the transistor Q1 turns on, and the transistor Q2 turns off. Therefore, the output terminal OUT is charged by the current flowing into the output terminal OUT from the second power supply terminal S2 through the transistor Q1, so that the level of the output signal $G_k$ increases.

When the node N1 attains the H level, the output signal $G_{k-1}$ of the preceding stage has not yet fallen, and the transistor Q13 is still on. Therefore, a current also flows into the output terminal OUT from the clock terminal CK through the transistor Q13. In other words, in the circuit of FIG. 3, the current flowing through the transistor Q13 also contributes to the rise of the output terminal OUT.

When the node N1 attains the H level, the transistor Q9 also turns on, but the node N5 is at the H level, and the transistor Q10 having a small on-state resistance is on-state. Therefore, at this moment, the node N4 is still at the L level. More specifically, as shown in FIG. 4, when the level of the node N1 increases at the time $t_3$, the coupling through the capacitive element C1 causes the level of the node N4 to slightly increase. Further, the increase in the level of the node N4 slightly increases the level of the node N5 via the overlap capacitance between the drain and gate of the transistor Q10.

When the output terminal OUT is charged to such a level that the level of the output signal $G_k$ exceeds a threshold voltage $V_{th}$ of the transistor Q16, the transistor Q16 turns on, and the level of the node N5 decreases (the transistor Q16 is configured to have a sufficiently low on-state resistance than the transistor Q14). Then, the transistor Q8 turns on, and a current flows from the node N3 to the node N5. Accordingly, the level of the node N3 decreases to follow the node N5. Thereupon, the transistor Q3 turns off, and the node N1 attains the H level in a high impedance state (floating state).

When the node N5 attains the L level, the transistor Q10 turns off. At this moment, the node N1 is at the H level, and the transistor Q9 is on-state. Therefore, the node N4 is charged by the transistor Q9, and the level of the node N4 increases (time tD). When the level of the node N4 increases, the potential at the node N1 is increased by the coupling through the capacitive element C1. It should be noted that, when the transistor Q9 charges the node N4, the potential of the gate of the transistor Q9 itself (node N1) is increased by the capacitive element C1, so that the transistor Q9 operates in non-saturation region. Therefore, the node N4 increases to the potential VDD (in other words, the transistor Q9 and the capacitive element C1 constitute a bootstrap circuit).

As described above, the time tD represents a time at which the potential at the node N1 is increased, i.e., a time at which the level of the node N4 increases. The time tD comes right after the level of the node N5 decreases to cause the transistor Q3 to turn off. At that moment, the node N1 has reached a sufficiently high level, since the node N1 is charged (pre-charged) until the transistor Q3 turns off. Therefore, when the potential at the node N1 is increased at the time tD, the potential at the node N1 can be increased to a potential high enough to allow the transistor Q1 to operate in non-saturation region. As a result, the potential of the output signal $G_k$ at the H level reaches VDD which is the same as that of the second power supply terminal S2.

Theoretically, the time tD at which the level of the node N4 increases (time at which the potential at the node N1 is increased) should be a certain time later than a time at which the clock signal CLK rises to cause the node N1 to begin to be charged, so that the time tD comes after the transistor Q3 turns off (after the nodes N3 and N5 attain the L level). The unit shift register $SR_k$ of FIG. 3 ensures a delay time by employing such configuration that the rise of the output signal $G_k$ causes the node N5 to be discharged which causes the node N4 to be charged. But the unit shift register $SR_k$ may employ other methods. For example, the gate line driving circuit 30 may be arranged with a delay circuit for delaying the clock signal CLK, so that the potential at the node N1 is increased in accordance with a rise of the output signal provided by the delay circuit.

It is possible to cause the output signal $G_{k-1}$ of the preceding stage to fall by increasing the output signal $G_k$ of the unit shift register $SR_k$ to a predetermined potential and causing the transistor Q12 of the unit shift register $SR_{k-1}$ of the preceding stage to turn on (therefore, there is a slight overlap of the activated period between the output signal $G_k$ of the unit shift register $SR_k$ and the output signal $G_{k-1}$ of the preceding stage).

When the output signal $G_{k-1}$ of the preceding stage attains the L level, the transistor Q13 turns off in the output circuit 20, at which moment the contribution of the transistor Q13 to the rise of the output signal $G_k$ ends. In the pull-up driving circuit 21, the transistor Q14 turns off, and the node N5 has the potential VSS at the L level. In the pull-down driving circuit 22, since the transistor Q17 turns off, the node N6 is maintained at the H level in the floating state.

In FIG. 4, the level of the node N6 slightly decreases during a certain period after the time $t_3$. This is because, when the output signal $G_{k-1}$ of the preceding stage falls, the level of the node N6 is decreased by the coupling of the overlap capacitance between the gate and source of the transistor Q17.

Herein, attention is given to the operation of the transistor Q8. During a period in which the unit shift register $SR_k$ is in the reset state, the node N5 is at the L level (VSS). Therefore, the transistor Q8 having the gate potential of VDD turns on, and the node N3 is maintained at the potential VSS which is the same as that of the node N5. During a period in which the node N5 is charged in accordance with the rise of the output signal $G_{k-1}$ of the preceding stage (time $t_1$ to time $t_3$), a current flows from the node N5 to the node N3, and the node N3 is maintained at the H level of the potential VDD−Vth.

At a time when the node N1 begins to be charged (pre-charged) in accordance with the rise of the clock signal CLK (time $t_3$), the potential at the node N3 is increased by the capacitance between the gate and channel of the transistor Q3, and the node N5 side becomes the source of the transistor Q8 because of the relationship of potentials. At this moment, since the potential at the node N5 is VDD−Vth, the voltage between the gate of the transistor Q8 (the third power supply terminal S3) and the source of the transistor Q8 (the node N5) is Vth, which causes the transistor Q8 to be in a boundary state between on and off. Therefore, a sub-threshold current flows through the transistor Q8 from the node N3 to the node N5. Because this is a minute current, an electrical charge discharged from the node N3 during a short period (≈tD−t3) in which the potential at the node N3 is increased is so little that the electrical charge can be almost disregarded.

In a period in which the node N5 is discharged in accordance with the rise of the output signal $G_k$ (time $t_3$ to time tD), the transistor Q8 turns on to cause a current to flow from the node N3 to node N5 this time, so that the node N3 attains the L level (VSS). Thereafter, while the node N5 is at the L level, the transistor Q8 is still on-state, and the node N3 is maintained at the L level.

As described above, the transistor Q8 changes its function in accordance with the change in the potentials at the node N3 and the node N5. In other words, the transistor Q8 serves as a resistive element for directly transmitting the level of the node N5 to the node N3 while the node N5 is charged. The transistor Q8 serves as a blocking element for insulating between the node N3 and the node N5 while the potential at the node N3 is increased. Further, the transistor Q8 serves as a resistive element for discharging the electrical charge in the node N3 to the node N5 while the node N5 is discharged.

Herein, the potential VDD2 supplied to the gate of the transistor Q8 has been described as being VDD which is the same as the potential of the output signal $G_{k-1}$ of the preceding stage at the H level (i.e., the potential of the clock signals CLK and /CLK at the high level), but the potential VDD2 may be any potential as long as the transistor Q8 can operate as described above. For example, if the potential VDD2 is too low, the transistor Q8 cannot charge the node N3 to a sufficiently high level, and the transistor Q3 cannot operate in non-saturation region even when the potential at the node N3 is increased, which is not preferable. On the other hand, when the potential VDD2 is configured to be higher than VDD, there is a problem in that the transistor Q8 does not turn off when the potential at the node N3 is increased (in other words, the transistor Q8 does not serve as the blocking element). Therefore, the potential VDD2 is less than or equal to VDD and is in such a range that allows the transistor Q8 to operate in non-saturation region when the potential at the node N3 is increased.

FIG. 4 is referenced again. At the time $t_4$, the clock signal CLK falls, but the level of each node of the unit shift register $SR_k$ does not change. Therefore, the output signal $G_k$ is maintained at the H level.

Subsequently the clock signal /CLK rises at the time $t_5$, the output signal $G_{k+1}$ of the subsequent stage is activated. Accordingly, since the transistor Q12 turns on in the output circuit 20, the output terminal OUT is discharged, and the output signal $G_k$ attains the L level. At this moment, the transistor Q4 of the pull-up driving circuit 21 turns on, and the node N1 is discharged to attain the L level. Therefore, the transistor Q1 turns off, which reduces an occurrence of a through-current flowing through the transistors Q1 and Q12.

In the pull-down driving circuit 22, the transistor Q19 turns on, and the node N6 is discharged to attain the L level. Accordingly, the transistor Q7 turns off, and the node N2 attains the H level. In other words, the unit shift register SR returns back to the reset state (initial state right before the time $t_1$). Therefore, the transistors Q2, Q5, Q11, Q15 and Q18 turn on, and the output terminal OUT and the node N1, N4, N5 and N6 attain the L level in a low impedance. This state is maintained until the output signal $G_{k-1}$ of the preceding stage is activated in the next frame period.

As described above, in the unit shift register $SR_k$ of FIG. 3, the transistor Q3 turns on in accordance with activation of the output signal $G_{k-1}$ of the preceding stage (or the start pulse SP), and subsequently, the output signal $G_k$ is changed to the activated level (H level) in accordance with activation of the clock signal of the clock terminal CK. Thereafter, the output signal $G_k$ is changed to the deactivated level (L level) in accordance with the output signal $G_{k+1}$ of the subsequent stage (or the output signal GDM of the dummy stage SRD).

Therefore, in response to activation of the start pulse SP input to the unit shift register $SR_1$, the gate line driving circuit 30 activates the output signals $G_1$, $G_2$, $G_3$, . . . in order with timing synchronized with the clock signals CLK and /CLK. Therefore, the gate line driving circuit 30 can sequentially drive the gate lines $GL_1$, $GL_2$, $GL_3$, . . . in a predetermined scanning cycle.

As described above, in the conventional unit shift register (FIG. 7 of Japanese Patent Application Laid-open No. 2004-78172), a clock signal (CKV) is provided to a first transistor (M1) used for charging a gate line. Therefore, at a rise of the clock signal (CKV), a capacitive coupling current flows through an overlap capacitance of the first transistor (M1). This current is not so much large in one unit shift register, but the gate line driving circuit has many unit shift registers to which the same clock signal is provided. Therefore, the current is considered to be rather large in terms of the gate line driving circuit. Especially, the above first transistor has a large overlap capacitance because the first transistor is configured to have a wide gate width in order to quickly charge the gate line. Therefore, the capacitive coupling current is large, which brings about the increase of power consumption.

On the other hand, in the unit shift register $SR_k$ of FIG. 3, the clock signal CLK is provided to the transistor Q3 and the transistor Q13. The transistor Q3 charges the node N1, but a capacitive component relating to the node N1 is extremely small compared with a parasitic capacitance of the gate line $GL_k$. More specifically, the capacitive component relating to the node N1 includes the capacitive element C1, the gate capacitance of the transistor Q1, the overlap capacitance between the gate and drain of the transistor Q1, the overlap capacitance between the gate and source of the transistor Q1, and the overlap capacitance between the gate and drain of each of the transistors Q4 and Q5. The summation of these capacitive components is one or more orders of magnitude smaller than the parasitic capacitance of the gate line $GL_k$. Therefore, the gate width of the transistor Q3 is allowed to be much smaller than the gate width of the transistor Q1 used to charge the gate line $GL_k$.

The main purpose of the operation of the transistor Q13 is to prevent the output terminal OUT from being in a high impedance state during the activated period of the output signal $G_{k-1}$ of the preceding stage. Since the output terminal OUT is maintained at the L level by the transistor Q2 until the output signal $G_{k-1}$ of the preceding stage is activated, the transistor Q13 is to maintain the already-discharged output terminal OUT at the L level. Therefore, it is not necessary for the transistor Q13 to flow a large current, and a high driving capacity is not required of the transistor Q13. Therefore, it is sufficient that the gate width of the transistor Q13 is one or more orders of magnitude smaller than the transistor Q1.

As described above, in the unit shift register $SR_k$ of FIG. 3, the clock signal is provided to only the transistors Q3 and Q13 having a small gate width (the clock signal is not provided to the transistor Q1 having a large gate width). Since the transistors Q3 and Q13 have a small overlap capacitance, a small capacitive coupling current is generated in the transistors Q3 and Q13. Therefore, the power consumption of the unit shift register $SR_k$ can be reduced. Especially, more significant effects can be achieved by the multiple-stage unit shift register such as the gate line driving circuit 30.

As described above, in the unit shift register $SR_k$ of FIG. 3, the transistor Q10 turns off (time tD) after the node N1 starts to be charged (time $t_3$) so that the potential at the node N1 is increased to a sufficiently high level. Therefore, during a period between the time $t_3$ to time tD of FIG. 4, a through-current flows from the second power supply terminal S2 to the first power supply terminal S1 through the transistors Q9 and Q10. However, this period is very short, and the through-current is generated only in the unit shift register of the first stage in the selection period. Therefore, the through-current hardly affects a power consumption of the entire gate line driving circuit 30.

[First Variation]

Figure 5:
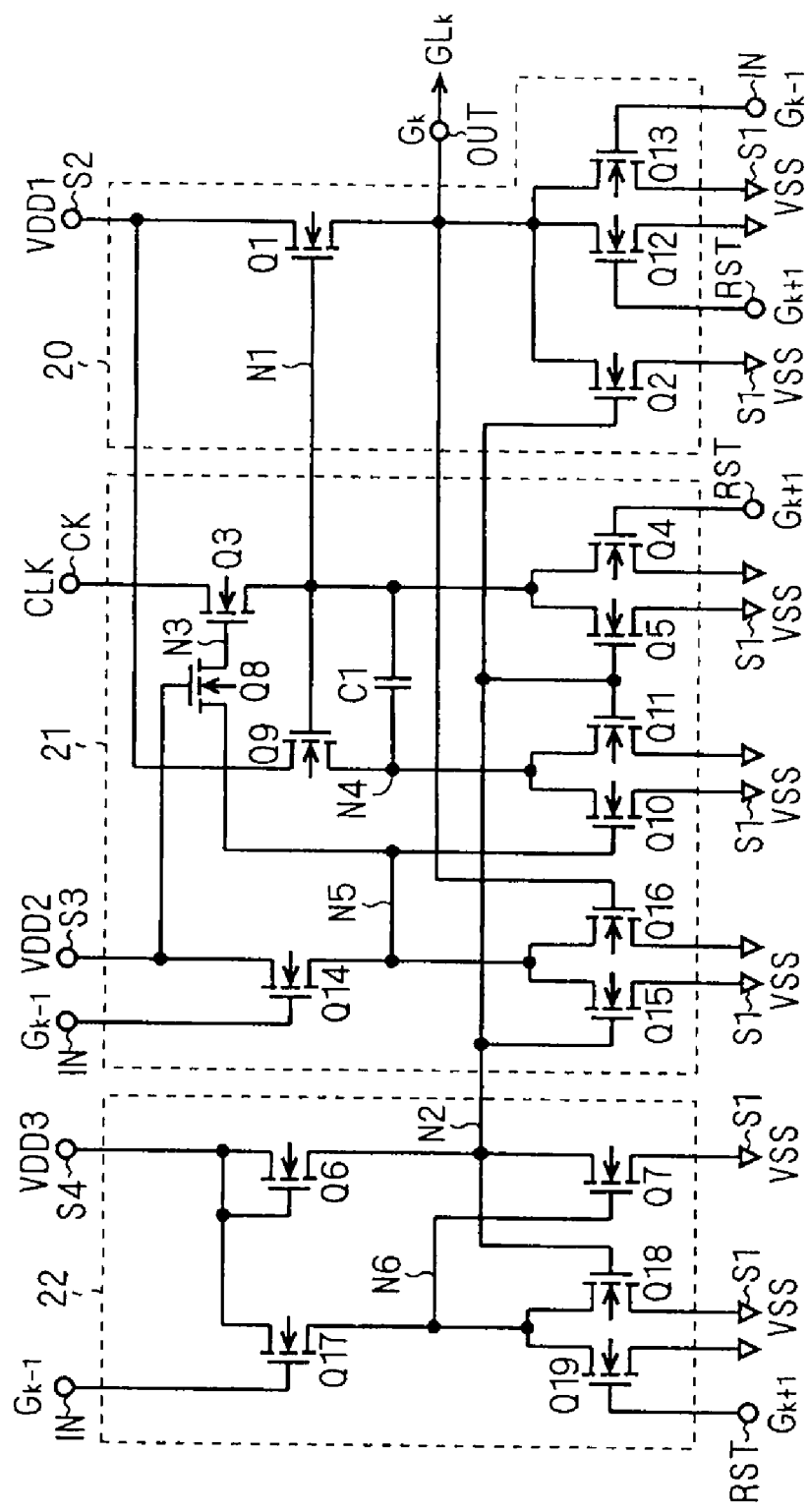
FIG. 5 is a circuit diagram showing the unit shift register according to the first variation of the first embodiment.

In FIG. 3, the transistor Q13 is connected between the output terminal OUT and the clock terminal CK. Alternatively, as shown in FIG. 5, the source of the transistor Q13 may be connected to the first power supply terminal S1. However, as described above, in the present embodiment, the activated period of the output signal $G_k$ of the unit shift register $SR_k$ and the activated period of the output signal $G_{k-1}$ of the preceding stage slightly overlap with each other. Therefore, in the configuration of FIG. 5, a through-current flows through the transistors Q1 and Q13 during that overlapped period. An attention should be paid to an increase of power consumption caused by this through-current.

On the other hand, in the configuration of FIG. 3, the transistor Q13 can also contribute to the rise of the output signal $G_k$. In this case, the above through-current does not occur, but a capacitive coupling current flows through the overlap capacitance between the source (drain) and the gate of the transistor Q13, which also causes an increase of power consumption. Which of these configurations is employed may be selected in accordance with electrical characteristics required of the circuit of the unit shift register $SR_k$.

The transistor Q13 prevents the output terminal OUT from being a high impedance during the activated period of the output signal $G_{k-1}$ of the preceding stage. However, since the activated period (one horizontal period (1H)) is short, a high impedance of the output terminal OUT during that period hardly causes a problem on the image display apparatus in terms of characteristics. Therefore, the transistor Q13 may be omitted.

The present variation can be applied to any of the following embodiments and variations thereof.

[Second Variation]

In the unit shift register $SR_k$ of FIG. 3, the transistor Q6 of the pull-down driving circuit 22 serves as a load element of the inverter. The load element for the inverter of the pull-down driving circuit 22 may be any element as long as the load element can maintain the node N2 at the H level during the non-selection period of the gate line $GL_k$. Therefore, for example, a current-driving element such as a constant-current element and a resistive element may be used instead of the transistor Q6.

Further, in FIG. 3, the constant high power supply potential VDD3 is supplied to the gate of the transistor Q6, but instead of VDD3, the clock signal /CLK having the same phase as the output signal $G_{k+1}$ of the subsequent stage may be supplied thereto. When the unit shift register $SR_k$ activates the output signal $G_k$, the transistor Q7 turns on for two horizontal periods (the time $t_1$ to the time $t_5$ in FIG. 4). In the circuit of FIG. 3, a flow-through current flows through the transistors Q6 and Q7 throughout the two horizontal period, but when the clock signal /CLK is supplied to the gate of the transistor Q7, the transistor Q6 is off during half of the period, so that the flow-through current can be made half. Alternatively, the clock signal /CLK may be supplied to both of the gate and drain of the transistor Q6.

The present variation can be applied to any of the following embodiments and variations thereof.

[Third Variation]

Figure 6:
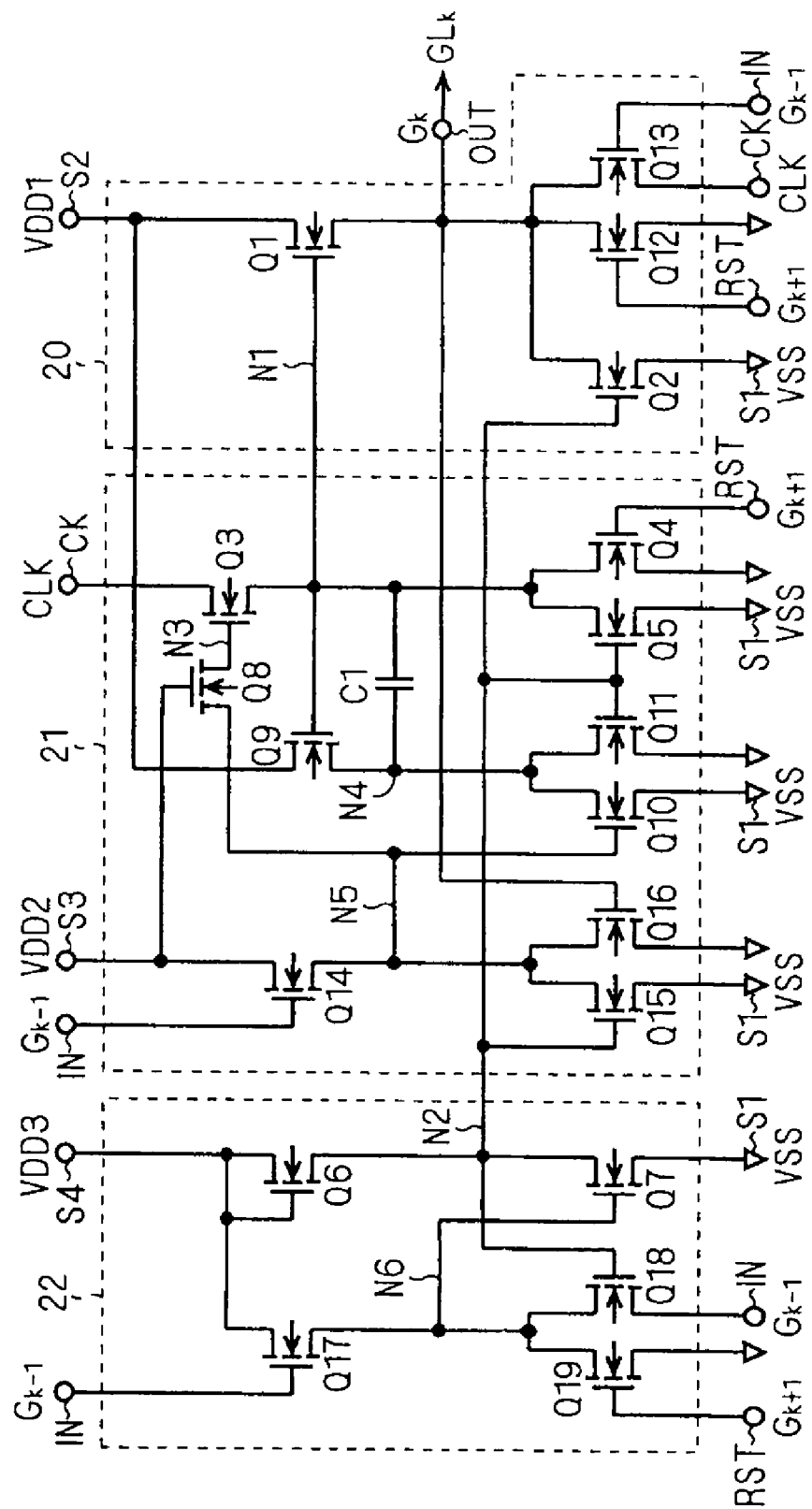
FIG. 6 is a circuit diagram showing the unit shift register according to the third variation of the first embodiment.

FIG. 6 is a circuit diagram showing the unit shift register $SR_k$ according to the third variation of the first embodiment. Compared with the circuit of FIG. 3, the source of the transistor Q18 of the pull-down driving circuit 22 is connected to the input terminal IN in this unit shift register $SR_k$.

In the circuit of FIG. 3, when the output signal $G_{k-1}$ of the preceding stage is activated, and the transistor Q17 begins to charge the node N6, the transistor Q18 is in on-state. Then, the node N6 is further charged, the transistor Q7 accordingly turns on, and the node N2 attains the L level. Thereupon, the transistor Q18 turns off. Therefore, the transistor Q17 is preferably configured to have a sufficiently smaller on-state resistance than the transistor Q18.

In contrast thereto, in the unit shift register $SR_k$ of FIG. 6, when the output signal $G_{k-1}$ of the preceding stage is activated, the transistor Q18 turns off because the source potential thereof increases. In other words, the transistor Q18 turns off at substantially the same time as the transistor Q17 turns on, in which state the node N6 is charged. Therefore, the node N6 can be charged regardless of the on-state resistance values of the transistors Q17 and Q18, and the circuit can be easily designed.

The present variation can be applied to any of the following embodiments and variations thereof.

[Fourth Variation]

Figure 7:
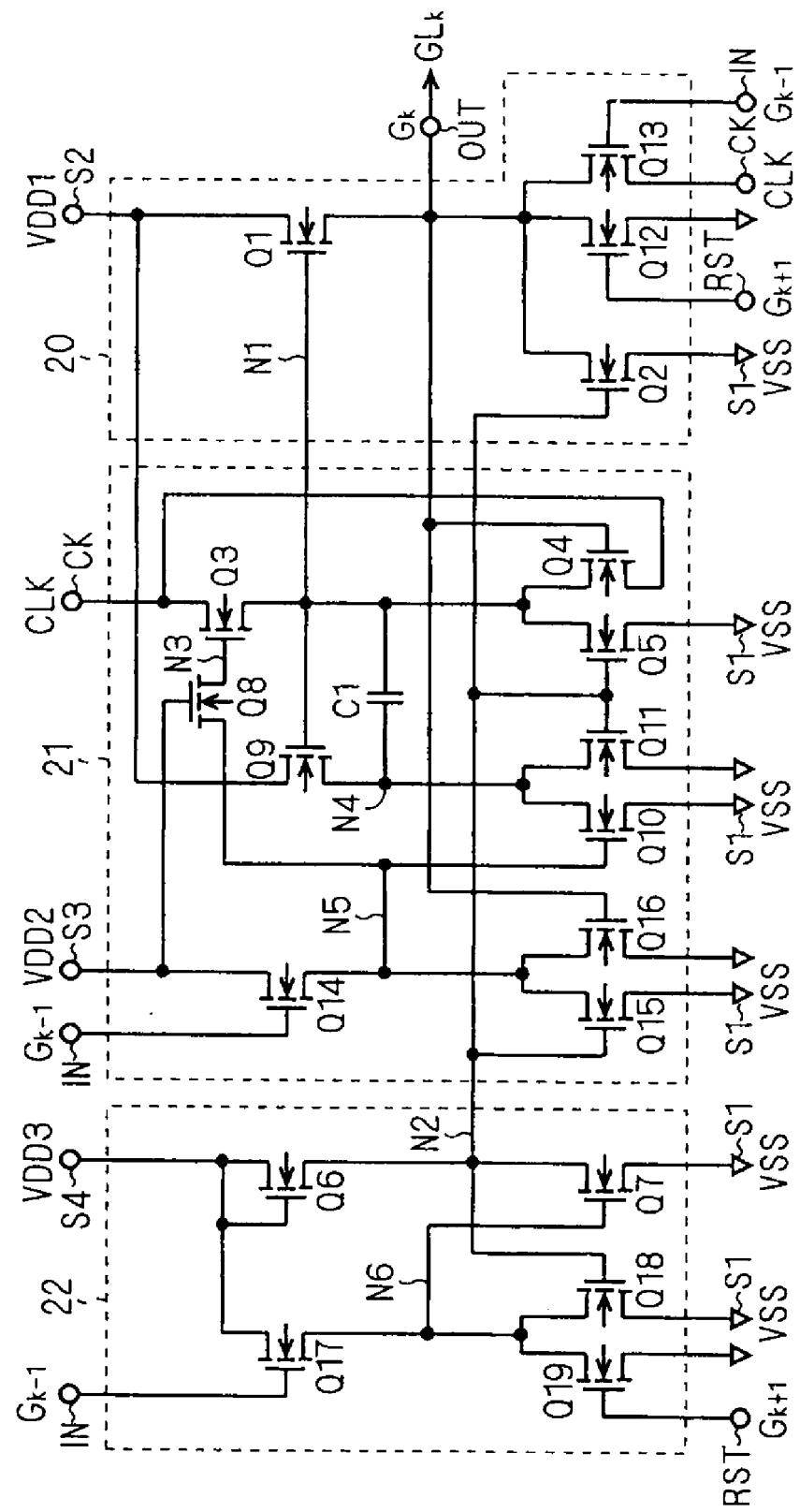
FIG. 7 is a circuit diagram showing the unit shift register according to the fourth variation of the first embodiment.

FIG. 7 is a circuit diagram showing the unit shift register $SR_k$ according to the fourth variation of the first embodiment. Compared with the circuit of FIG. 3, this unit shift register $SR_k$ is configured such that the source (drain) of the transistor Q4 of the pull-up driving circuit 21 is connected to the clock terminal CK (the transistor Q4 is connected between the node N1 and the clock terminal CK), and the gate of the transistor Q4 is connected to the output terminal OUT In the unit shift register $SR_k$ of FIG. 3, the output signal $G_k$ is deactivated (change from the H level to the L level) by turning on the transistor Q12 in accordance with activation of the output signal $G_{k+1}$ of the subsequent stage. At this moment, the transistor Q4 also turns on in accordance with activation of the output signal $G_{k+1}$ of the subsequent stage. When the node N1 attains the L level, the transistor Q1 turns off. Therefore, a through-current is prevented from flowing through the transistors Q1 and Q12. However, since it takes a certain time to discharge the node N1, the transistor Q1 turns off in the discharge time after the transistor Q12 turns off. Therefore, there is a short time in which both of the transistors Q1 and Q12 turn on, during which the through-current flows.

In the circuit of FIG. 7, when the output signal $G_k$ is at the H level, the transistor Q4 begins to discharge the node N1 upon the fall of the clock signal CLK (corresponding to the time $t_4$ of FIG. 4), which causes the transistor Q1 to turn off. At this moment, the H level of the output signal $G_k$ is maintained by the parasitic capacitance of the gate line. However, the level of the output signal $G_k$ slightly decreases when the node N1 attains the L level because of the coupling of the overlap capacitance and the gate capacitance of the transistor Q1 (the amount of this decrease is determined by a ratio between the parasitic capacitance of the gate line $GL_k$ and the gate capacitance and the overlap capacitance of the transistor Q1).

On the other hand, the transistor Q12 turns on in accordance with activation of the output signal $G_{k+1}$ of the subsequent stage in the same manner as the case of FIG. 3. Thereupon, the output signal $G_k$ is deactivated.

According to the present variation, the transistor Q1 turns off earlier than the transistor Q1 in the circuit of FIG. 3. Therefore, it is possible to reduce the period in which both of the transistors Q1 and Q12 turn on, and a through-current can be eliminated.

As shown in FIG. 4, there is a certain period (time $t_4$ to time $t_5$) between the fall of the clock signal CLK and the rise of the clock signal /CLK. Especially, shortening the discharging time at the node N1 by the transistor Q4 than this period makes it possible that there is no time in which both of the transistors Q1 and Q12 turn on, In the circuit of FIG. 7, however, the clock signal CLK is also provided to the source (drain) of the transistor Q4, and accordingly, not only the transistors Q3 and Q13 but also the transistor Q4 have the capacitive coupling current flowing through the overlap capacitance. Therefore, it is actually impossible to obtain the effect of reducing the power consumption according to the present variation, unless the power consumption of the capacitive coupling current is less than the power consumption of the through-current flowing through the transistors Q1 and Q12 occurring in the circuit of FIG. 3.

The present variation can be applied to any of the following embodiments and variations thereof.

[Fifth Variation]

FIG. 8 is a circuit diagram showing the unit shift register $SR_k$ according to the fifth variation of the first embodiment. In this unit shift register $SR_k$, in addition to the output signal $G_k$ provided to the gate line $GL_k$ (hereinafter referred to as "first output signal" in the present variation), an output signal $GD_k$ provided to the gate of the transistor Q4 of the unit shift register $SR_{k-1}$ (hereinafter "second output signal") can be generated. In other words, in this unit shift register $SR_k$ according to the present variation, the second output signal $GD_{k+1}$ of the subsequent stage is provided to the gate of the transistor Q4.

Compared with the circuit of FIG. 3, the output circuit 20 of the unit shift register $SR_k$ of FIG. 8 is arranged with a generation circuit for generating the second output signal $GD_k$ including the transistors Q1D, Q2D, Q12D and Q13D. The transistor Q1D is connected between an output terminal OUTD of the second output signal $GD_k$ and the second power supply terminal S2, and the gate of the transistor Q1D is connected to the node N1. The transistor Q2D is connected between the output terminal OUTD and the first power supply terminal S1, and the gate of the transistor Q2D is connected to the node N2. The transistor Q12D is connected between the output terminal OUTD and the first power supply terminal S1, and the gate of the transistor Q12D is connected to the reset terminal RST. The transistor Q13D is connected between the output terminal OUTD and the clock terminal CK, and the gate of the transistor Q13D is connected to the input terminal IN.

As can be seen from FIG. 8, in the unit shift register $SR_k$ according to the present variation, both of the generation circuit for generating the first output signal $G_k$ including the transistors Q1, Q2, Q12 and Q13 and the generation circuit for generating the second output signal $GD_k$ including the transistors Q1D, Q2D, Q12D and Q13D have substantially the same configuration. Accordingly, the first output signal $G_k$ and the second output signal $GD_k$ are signals of substantially the same waveform. Therefore, the unit shift register $SR_k$ of FIG. 8 can operate in the same manner as the circuit of FIG. 3.

The gate line $GL_k$ provided with the first output signal $G_k$ has a large parasitic capacitance. On the other hand, the gate capacitance of the transistor Q4 of the preceding stage provided with the second output signal $GD_k$ is extremely smaller than the parasitic capacitance of the gate line $GL_k$. Therefore, a rising rate of the second output signal $GD_k$ is faster than the first output signal $G_k$.

Therefore, in the unit shift register $SR_k$, the second output signal $GD_{k+1}$ of the subsequent stage provided to the gate of the transistor Q4 rises faster than the first output signal $G_{k+1}$ of the subsequent stage provided to the gate of the transistor Q12. Therefore, compared with the case of FIG. 3, the transistor Q4 discharges the node N1 earlier, and a time in which both of the transistors Q1 and Q12 turn on is reduced. As a result, it is possible to reduce the through-current flowing through the transistors Q1 and Q12.

The second output signal $GD_k$ is a signal of substantially the same waveform as the first output signal $G_k$. Therefore, the output signal $G_k$ may be provided to the input terminal IN of the subsequent stage (i.e., the gate of the transistors Q14 and Q17).

The present variation can be applied to any of the following embodiments and variations thereof. However, when the present variation is applied to the later-described seventh embodiment, a switching circuit should be arranged to switch which of the transistor Q4 of the unit shift register $SR_{k-1}$ of the preceding stage or the transistor Q4 of the unit shift register $SR_{k+1}$ of the subsequent stage the second output signal $GD_k$ is provided to in accordance with a shift direction of the signal.

[Sixth Variation]

In a display apparatus, the fall of the output signal G provided from the gate line driving circuit 30 to the gate line GL defines a time at which a display signal is written to a pixel. Herein, the time of the display signal is assumed to be fixed. When, for example, the rise of the output signal $G_k$ provided to the gate line $GL_k$ of the $k^{th}$ line is late, there is a problem in that data to be written to the subsequent line (k+1$^{st}$ line) is written to the pixel of the $k^{th}$ line by mistake. Therefore, in the present variation, a unit shift register SR capable of increasing the rate of the fall of the output signal G is suggested.

In the unit shift register $SR_k$ of FIG. 3, the fall of the output signal $G_k$ (deactivation) is performed by turning on the transistor Q12 in accordance with the rise of the output signal $G_k+_1$ of the subsequent stage. Therefore, the fall rate of the output signal $G_k$ depends on the rise rate of the output signal $G_{k+1}$ of the subsequent stage.

On the other hand, the rise (activation) of the output signal $G_{k+1}$ of the subsequent stage is performed by a series of operations as follows: in the unit shift register $SR_{k+1}$, the transistor Q1 turns on; accordingly the transistor Q16 turns on; subsequently the transistor Q10 turns off, the node N4 is charged by the transistor Q9; and accordingly the potential at the node N1 is increased with the capacitive element C1. Therefore, the rising rate of the output signal $G_{k+1}$ tends to be affected by electrical characteristics of each transistor (a threshold voltage and a mobility of carriers) and usage conditions (a voltage and a temperature). In other words, the fall rate of the output signal $G_k$ of the unit shift register $SR_k$ of FIG. 3 tends to be affected by the electrical characteristics of each transistor of the unit shift register $SR_{k+1}$ and the usage conditions.

Figure 9:
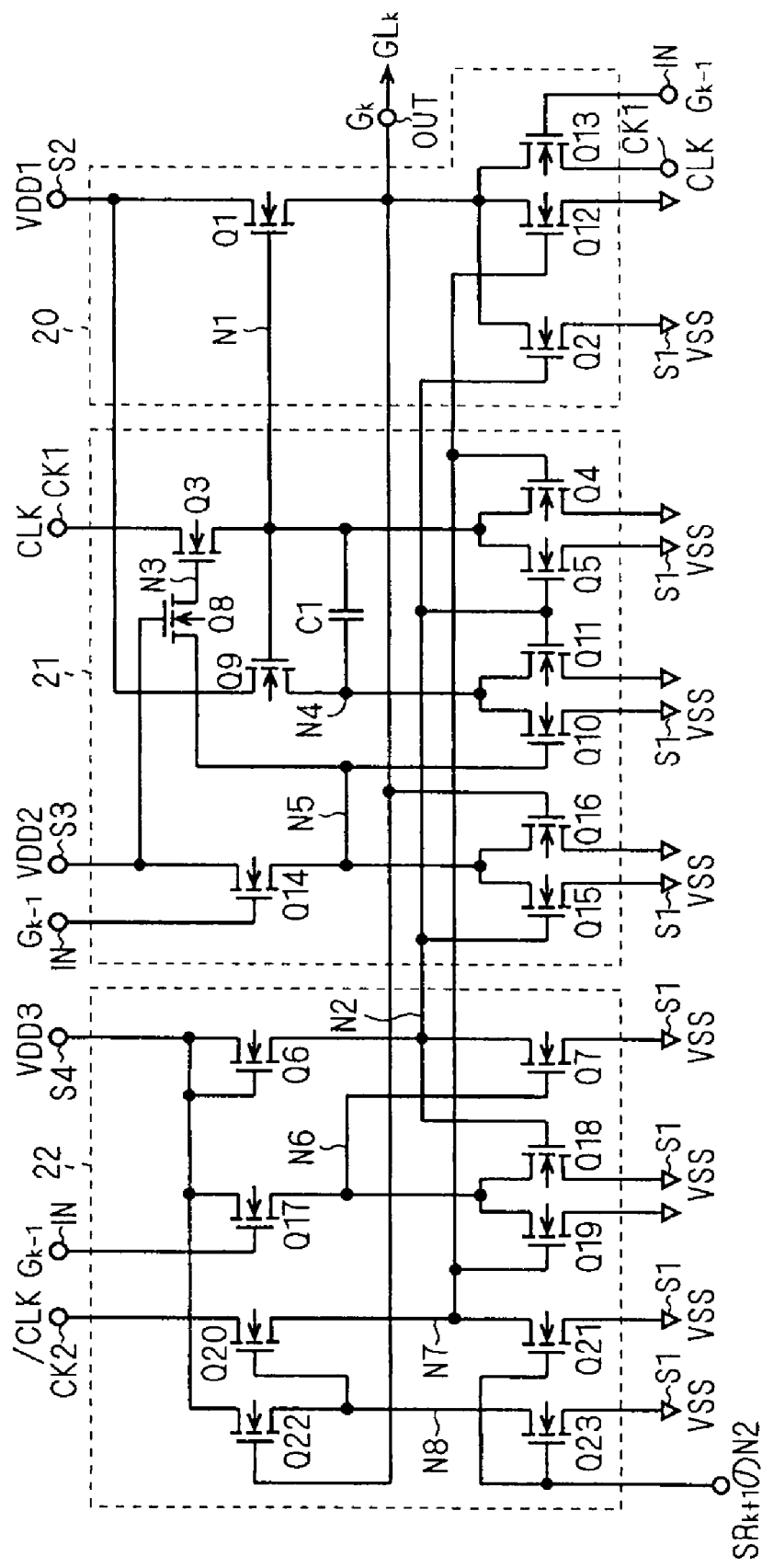
FIG. 9 is a circuit diagram showing the unit shift register according to the sixth variation of the first embodiment.

FIG. 9 is a circuit diagram showing the unit shift register $SR_k$ according to the sixth variation of the first embodiment. Compared with the circuit of FIG. 3, the pull-down driving circuit 22 of this unit shift register $SR_k$ is arranged with a circuit including transistors Q20 to Q23. The circuit including transistors Q20 to Q23 controls the transistors Q4, Q12 and Q19, which, in FIG. 3, are controlled by the output signal $G_{k+1}$ of the subsequent stage. Furthermore, the circuit including transistors Q20 to Q23 provides the clock signal /CLK to the gates of the transistors Q4, Q12 and Q19 at least during the activated period of the output signal $G_k$.

Therefore, both of the clock signals CLK and /CLK are provided to the unit shift register $SR_k$ of FIG. 9. In the present variation, a terminal corresponding to the clock terminal CK of FIG. 3 is defined as "first clock terminal CK1", and a terminal provided with the clock signal /CLK having a phase different therefrom is defined as "second clock terminal CK2." In other words, in odd number stages of the gate line driving circuit 30 having the configuration of FIG. 2, the clock signal CLK is provided to the first clock terminal CK1, and the clock signal /CLK is provided to the second clock terminal CK2. In even number stages, the clock signal /CLK is provided to the first clock terminal CK1, and the clock signal CLK is provided to the second clock terminal CK2.

In the present variation, a node connected to the gates of the transistors Q4, Q12 and Q19 is defined as "node N7." The transistor Q20 is connected between the node N7 and the second clock terminal CK2. The transistor Q21 is connected between the node N7 and the first power supply terminal S1. Where a node connected to the gate of the transistor Q20 is defined as "node N8", the transistor Q22 is connected between the node N8 and the fourth power supply terminal S4, and the transistor Q23 is connected between the node N8 and the first power supply terminal S1. The gate of the transistor Q22 is connected to the output terminal OUT of the unit shift register $SR_k$. The gates of the transistors Q21 and Q23 are connected to the node N2 of the unit shift register $SR_{k+1}$ of the subsequent stage. The drain of the transistor Q22 may be connected to the output terminal OUT (in other words, the transistor Q22 is diode-connected between the output terminal OUT and the node N8).

Before the selection period of the unit shift register $SR_k$, the output signal $G_k$ is at the L level, and the node N2 of the unit shift register $SR_{k+1}$ of the subsequent stage is at the H level. Accordingly, the transistor Q22 is off-state, and the transistors Q21 and Q23 are on-state. Therefore, the node N8 is at the L level, and the transistor Q20 is in off-state. Accordingly, the node N7 is at the L level.

When it is the selection period of the unit shift register $SR_k$ (activated period of the output signal $G_k$), and the output signal $G_k$ rises (time $t_3$ of FIG. 4), the transistor Q22 turns on. At this moment, the node N2 of the unit shift register $SR_{k+1}$ attains the L level, the transistors Q21 and Q23 turn off. Accordingly, the node N8 attains the H level (VDD−Vth), and the transistor Q20 turns on. The clock signal /CLK is provided to the node N7. At this moment, however, since the clock signal /CLK is at the L level, the node N7 is still at the L level.

Then, when the clock signal /CLK rises, the level of the output signal $G_{k+1}$ of the subsequent stage begins to rise (time $t_5$ of FIG. 4). On the other hand, in the unit shift register $SR_k$, the potential at the node N7 increases in accordance with the rise of the clock signal /CLK. At this moment, since the potential at node N8 is increased by the coupling of the capacitance between the gate and channel of the transistor Q20, the transistor Q20 operates in non-saturation region. Accordingly, the node N7 is rapidly charged to attain the H level of the potential VDD. Therefore, the transistor Q12 turns on at substantially the same time as the rise of the clock signal /CLK, and the output terminal OUT is discharged, which causes the fall of the output signal $G_k$.

As described above, in the unit shift register $SR_k$ of FIG. 9, the output signal $G_k$ quickly falls upon the rise of the clock signal /CLK. Further, since the fall rate of the output signal $G_k$ does not rely on the rising rate of the output signal $G_{k+1}$ of the subsequent stage, the fall rate of the output signal $G_k$ is hardly affected by transistor characteristics and usage conditions. Therefore, the above problem of erroneous writing on the image display apparatus can be solved.

In the unit shift register $SR_k$ of FIG. 9, although the transistor Q12 turns on earlier, the transistor Q4 turns on at the same time. Accordingly, the node N1 is discharged, and the transistor Q1 is turned off. Therefore, it is possible to reduce increase of the through current flowing through the transistors Q1 and Q12. At the same time, the transistor Q19 also turns on, and the unit shift register $SR_k$ attains the reset state at substantially the same time as the rise of the clock signal /CLK.

[Seventh Variation]

In the unit shift register $SR_k$ of FIG. 3, the rate of the increase in the level of the node N4 relies on the potential at the node N1, since it is determined by the on-state resistance of the transistor Q9. The potential at the node N1 is determined by what degree the potential at the node N1 is increased by the capacitive element C1.

In this operation for increasing the node N1, the gate capacitance (including the overlap capacitance) of the transistor Q1, serving as the parasitic capacitance of the node N1, suppresses the increase in the potential at the node N1. But since it is necessary for the transistor Q1 to have a wide gate width, the gate capacitance thereof is large. In other words, in the circuit of FIG. 3, the parasitic capacitance of the node N1 is large, and there is a possibility that the increasing rate of the level of the node N4 slows down before increasing the potential at the node N1 to a sufficiently high level. Hereinbelow, a variation for taking care of this problem will be described.

Figure 10:
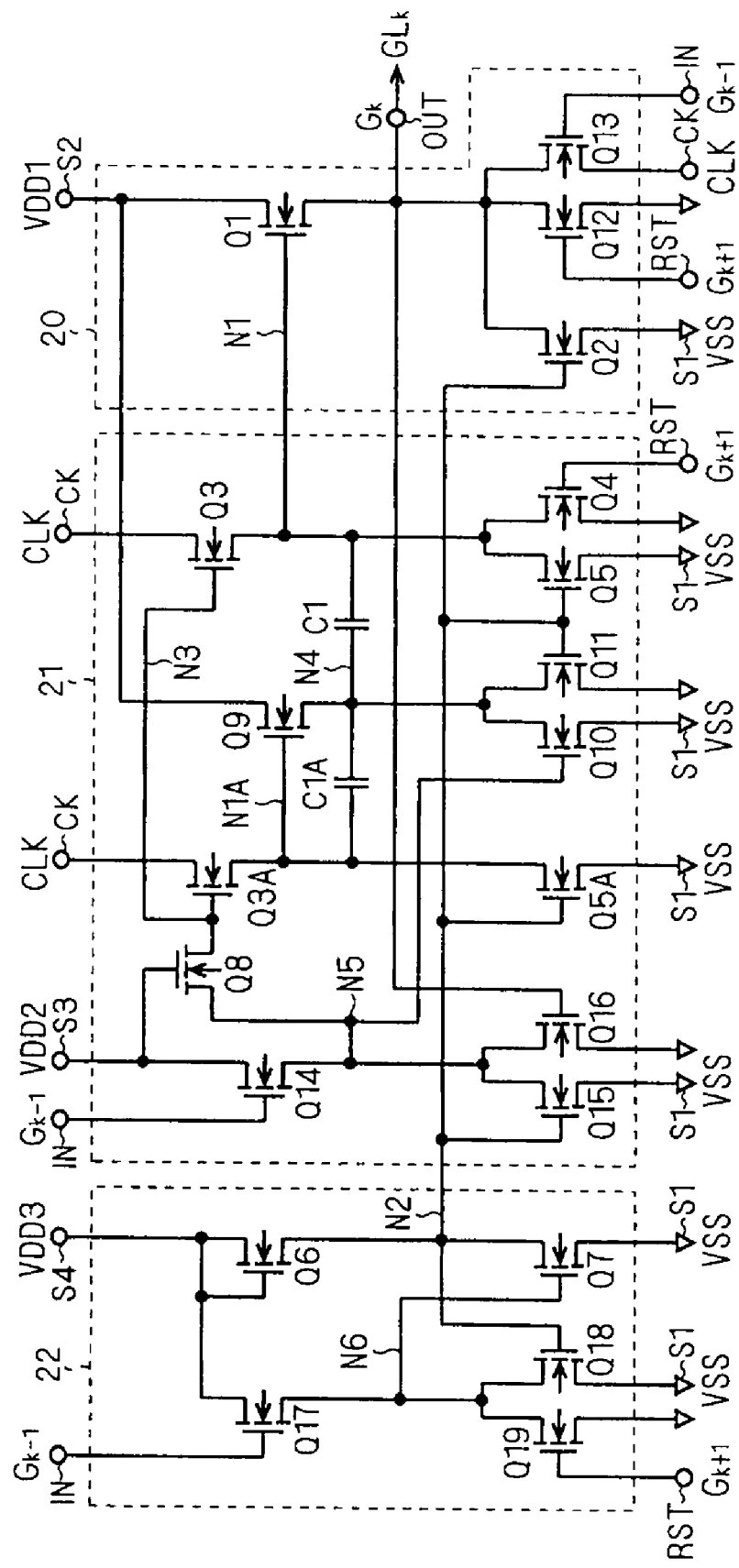
FIG. 10 is a circuit diagram showing the unit shift register according to the seventh variation of the first embodiment.

FIG. 10 is a circuit diagram showing the unit shift register $SR_k$ according to the seventh variation of the first embodiment. In this unit shift register $SR_k$, the gate of the transistor Q9 is separated from the node N1 having a large parasitic capacitance.

In the circuit of FIG. 10, transistors Q3A and Q5A are arranged in parallel with the transistors Q3 and Q5, and the gate of the transistor Q9 is connected to a connection node (defined as "node N1A") between the transistors Q3A and Q5A.

The transistor Q3A is connected between the node N1A and the clock terminal CK, and the gate of the transistor Q3A is connected to the gate (node N3) of the transistor Q3. The transistor Q5A is connected between the node N1A and the first power supply terminal S1, and the gate of the transistor Q5A is connected to the gate (node N2) of the transistor Q5. A capacitive element C1A is connected between the node N1A and the node N4.

The circuit including the transistors Q3A and Q5A and the capacitive element C1A and the circuit including the transistors Q3 and Q5 and the capacitive element C1 have the same configuration with each other and therefore operates in the same manner. In other words, the level of the node N1A changes in substantially the same manner as the node N1. Therefore, the unit shift register $SR_k$ of FIG. 10 can operate in the same manner as the circuit of FIG. 3. When the transistor Q9 charges the node N4, the potential of the gate (node N1A) of the transistor Q9 itself is increased by the capacitive element C1A, and the transistor Q9 operates in non-saturation region. Therefore, the node N4 in the circuit of FIG. 10 also increases to the potential VDD (in other words, the transistor Q9 and the capacitive element C1A constitute a bootstrap circuit.

However, since any element corresponding to the transistor Q4 is not arranged in the node N1A, the fall at the node N1A takes place later compared with the fall at the node N1. However, since the transistor Q4 is arranged for the purpose of suppressing the through-current flowing through the transistors Q1 and Q12, the transistor Q4 need not be arranged in the node N1A.

In the unit shift register $SR_k$ of FIG. 10, the gate of the transistor Q9 is not connected to the node N1 having a large parasitic capacitance, and accordingly, the parasitic capacitance of the gate of the transistor Q9 can be made smaller than that in the circuit of FIG. 3.

Compared with the capacitive element C1A, the parasitic capacitance of the node N1A is so small that it can almost be ignored. Therefore, when the level of the node N4 increases to the potential VDD, the level of the node N1A increases to approximately 2·VDD. Therefore, the rise of the node N4 becomes faster, and accordingly, the rise of the node N1 becomes faster. As a result, the rise of the output signal $G_k$ becomes faster.

In the present variation, however, the clock signal CLK is also provided to the transistor Q3A. Therefore, an attention should be paid to an occurrence of the capacitive coupling current flowing through the overlap capacitance of the transistor Q3A.

Second Embodiment

Figure 11:
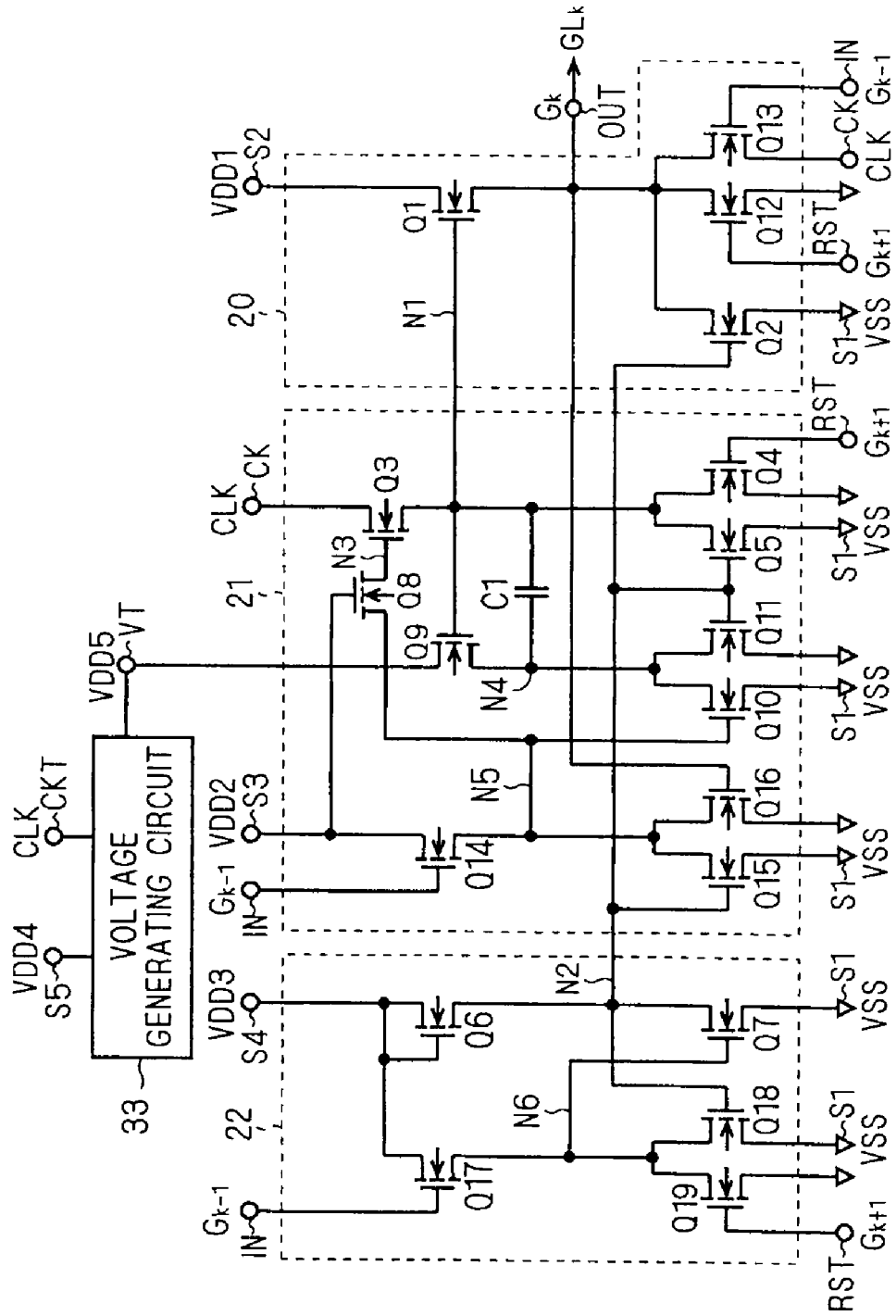
FIG. 11 is a circuit diagram showing the unit shift register according to the second embodiment.

FIG. 11 is a circuit diagram showing a configuration of a unit shift register according to the second embodiment. As shown in FIG. 11, in the present embodiment, a voltage generating circuit 33 for providing a predetermined potential VDD5 to the drain of the transistor Q9 is connected to the unit shift register SR according to the first embodiment (FIG. 3).

The voltage generating circuit 33 has a fifth power supply terminal S5 that is supplied with a high power supply potential VDD4, a voltage output terminal VT that outputs the potential VDD5, and at least one clock input terminal with which a predetermined clock signal is input (FIG. 11 shows a clock input terminal CKT as a representative example). In the present embodiment, one of the multi-phase clock signals that drive the plurality of cascade-connected unit shift register circuits SR (i.e., the gate line driving circuit 30) is used as the clock signal input to the clock input terminal (FIG. 11 shows a clock signal CLK as a representative example).

The voltage generating circuit 33 generates the output potential VDD5 that is higher than the power-supply potential VDD4, on the basis of the potential VDD4 supplied to the fifth power-supply terminal S5 and the clock signal input to the clock input terminal CKT. The potential VDD5 is higher than the amplitude of the clock signals CLK and /CLK (H level potential), with respect to the low power-supply potential VSS.

Figure 12:
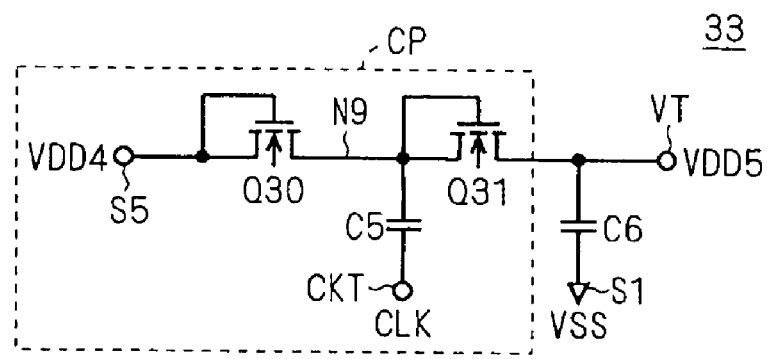
FIG. 12 is a circuit diagram showing a voltage generating circuit according to the second embodiment.

FIG. 12 shows an example of a specific circuit configuration of the voltage generating circuit 33. The voltage generating circuit 33 uses a charge pump circuit CP in order to obtain the high potential output. The charge pump circuit CP includes transistors Q30 and Q31 and a capacitive element C5. The output end of the charge pump circuit CP, i.e., the voltage output terminal VT, is provided with a capacitive element C6.

In the present embodiment, the voltage generating circuit 33 (the charge pump circuit CP and the stabilizing capacitance C6) is formed on the same insulating substrate as that formed with the shift register circuit. Basically, a charge pump circuit is formed of at least two rectifier elements (diode elements) and at least one capacitive element. As the diode elements, the present embodiment uses the diode-connected transistors Q30 and Q31 that have the same structure as those used in the shift register circuit. Also, the capacitive element C5 having the same structure as the pixel capacitances (the capacitors 17 shown in FIG. 1) is used as the capacitive element. The capacitive element C6 is provided to stabilize the output of the charge pump circuit CP, and the capacitive element C6, too, has the same structure as the pixel capacitances. This allows the voltage generating circuit 33 to be fabricated in parallel with the fabrication of the shift register and pixel circuitry, without requiring an increased number of manufacturing process steps and at less manufacturing costs.

As shown in FIG. 12, the transistors Q30 and Q31 as diode elements (hereinafter respectively referred to as "diode element Q30" and "diode element Q31") are connected in series between the fifth power-supply terminal S5 supplied with the high power-supply potential VDD4 and the voltage output terminal VT outputting the output potential VDD5. The diode elements Q30 and Q31 are both connected such that they have their anodes on the side of the fifth power-supply terminal S5 and their cathodes on the side of the voltage output terminal VT.

Where the connection node between the diode elements Q30 and Q31 is defined as "node N9", the capacitive element C5 is connected between the clock input terminal CKT and the node N9. The capacitive element C5 is provided to perform a charge-pump operation to repeatedly increase the potential at the node N9, and therefore, an arbitrary clock signal can be input to the clock input terminal CKT. The clock signal may be any of the clock signals CLK and /CLK that drive the unit shift register circuits SR. This avoids the necessity of separately providing a clock signal generating circuit for driving the charge pump circuit CP, thus avoiding increased circuit scale. In the present embodiment, it is assumed that the clock signal CLK is input to the clock input terminal CKT of the circuit of FIG. 12. The capacitive element C5 is hereinafter referred to as "charge pump capacitance."

The capacitive element C6 is provided to stabilize the output potential VDD5 when a current flows from the voltage output terminal VT to the load (the node N4 of the unit shift register SR), and the capacitive element C6 is connected between the voltage output terminal VT and the first power-supply terminal S1 that is supplied with the low power-supply potential VSS. The capacitive element C6 is hereinafter referred to as "stabilizing capacitance". One end of the stabilizing capacitance C6 is not necessarily connected to the first power-supply terminal S1, and it can be connected to any low-impedance node that is supplied with a constant voltage.

Hereinafter, the operation of the circuit of FIG. 12 will be described. All of the threshold voltages of the transistors of the voltage generating circuit 33 are assumed to be Vth.

When the potential VDD4 is supplied to the fifth power-supply terminal S5, the diode element Q30 turns on and the potential at the node N9 attains VDD4−Vth. Further, the potential at the node N9 turns on the diode element Q31, and the potential at the voltage output terminal VT attains VDD4−2*Vth.

Thereafter, the clock signal CLK (amplitude VDD) rises, and then the coupling through the charge pump capacitance C5 increases the potential at the node N9. When the parasitic capacitance of the node N9 is ignored, the potential at the node N9 rises to VDD4−Vth+VDD. The potential risen at the node N9 causes the diode element Q31 to turn on, and a current flows from the node N9 to the voltage output terminal VT. This raises the level of the voltage output terminal VT by a certain amount, and in the contrary, the level of the node N9 is lowered by an amount corresponding to the charge flown out.

Then, when the clock signal CLK falls, the potential at the node N9 is pulled down by the coupling through the charge pump capacitance C5. When the potential at the node N9 was increased as mentioned above, a charge flew out from the node N9 to the voltage output terminal VT. Accordingly, after the potential was pulled down, the level of the node N9 is lower than the level VDD4−Vth that it exhibited before the potential at the node N9 was increased (before the rise of the clock signal CLK). However, the lowering of the potential at the node N9 causes the diode element Q30 to turn on, and therefore, the node N9 is soon charged by the power supply terminal S5 and returns to VDD4−Vth.

It should be noted that the potential at the node N9 is lower than that at the voltage output terminal VT, because the potential at the voltage output terminal VT was raised when the potential at the node N9 was increased as mentioned above, but the potential at the voltage output terminal VT is maintained at the raised level because the diode element Q31 blocks current flow in the direction from the voltage output terminal VT to the node N9.

Subsequently, this operation is repeated at each input of the clock signal CLK, and ultimately, the potential VDD5 at the voltage output terminal VT attains VDD4−2*Vth+VDD.

Now, it is assumed that the above potentials VDD1 to VDD4 all have an equal value and that value is VDD which is equal to the H level of the clock signals CLK and /CLK. In such case, the final output potential VDD5 of the voltage generating circuit 33 is 2*VDD−2*Vth, which is given as the drain potential of the transistor Q9. Under the same assumption, the drain potential of the transistor Q9 of the unit shift register circuit SR of the first embodiment is, for example, VDD (=VDD1). That is, according to the unit shift register circuit SR of the present embodiment, the voltage generating circuit 33 supplies the drain of the transistor Q9 with the potential VDD5 (=2*VDD−2*Vth) higher than the H level of the clock signals CLK and /CLK even when each of the high power-supply potentials is the potential VDD, which equals to the H level of the clock signals CLK and /CLK.

Therefore, in the present embodiment, the transistor Q9 is capable of charging the node N4 to a higher potential than that in the first embodiment. As a result, since the potential at the node N1 is increased to a higher level, the transistor Q1 exhibits a smaller on-state resistance when the output signal $G_k$ is output, which allows the output signal $G_k$ to rise more quickly, thus allowing the shift register circuit to operate at higher rate. In other words, the rising rate of the output signal $G_k$ is not lowered even when the channel width of the transistor Q1 is reduced, which allows a reduction of the area required for the shift register circuit.

The present embodiment has shown an example in which the voltage generating circuit 33 (the charge pump circuit CP and the stabilizing capacitance C6) are formed on the same substrate as that formed with the shift register circuit, but all or part of its components may be formed externally to the substrate and connected thereto. This reduces the required area of the substrate, but the number of terminals is increased because it requires formation of external connection terminals on the substrate to connect the circuitry in the substrate and the voltage generating circuit 33 (or part of it).

For example, the diode elements of the charge pump circuit CP of the voltage generating circuit 33 may be formed on the same substrate as that formed with the shift register circuit, with the capacitive elements (the charge pump capacitance and the stabilizing capacitance) adopted as external components. This makes it possible to simplify the manufacturing process by fabricating the diode elements as transistors having the same structure as those of the shift register circuit, and also facilitates provision of capacitive elements with larger capacitances. Further, the parasitic capacitance of the circuit can be reduced by adopting the diode elements and the stabilizing capacitance as external components and forming the charge pump capacitance within the substrate.

[First Variation]

The voltage generating circuit 33 shown in FIG. 12 supplies charge to the voltage output terminal VT through the charge pump capacitance C5 when the clock signal CLK rises, but the supply of charge to the voltage output terminal VT disappears when the clock signal CLK falls. Accordingly, while the clock signal CLK is at the L level, the voltage generating circuit 33 supplies current to the load (the node N4 of the unit shift register circuit SR) with the charge accumulated in the voltage stabilizing capacitance C6. That is, while the clock signal CLK is at the L level, the charge of the stabilizing capacitance C6 is only discharged, and the potential at the voltage output terminal VT (potential VDD5) decreases.

Figure 13:
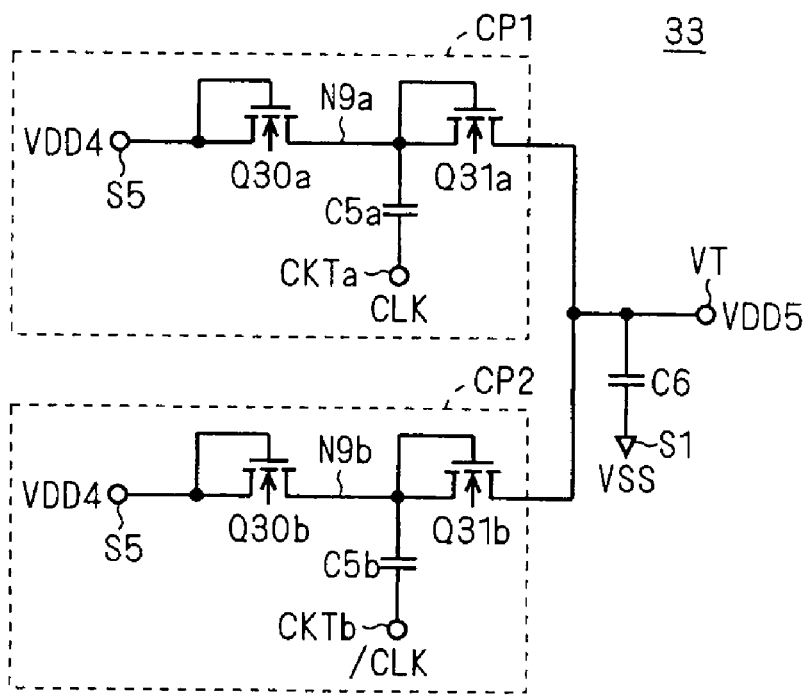
FIG. 13 is a circuit diagram showing the voltage generating circuit according to the first variation of the second embodiment.

FIG. 13 is a circuit diagram illustrating the configuration of the first variation of the voltage generating circuit 33 according to the second embodiment. This voltage generating circuit 33 includes parallel-connected, two charge pump circuits CP1 and CP2.

The charge pump circuit CP1 includes diode-connected transistors (diode elements) Q30a and Q31a, and a charge pump capacitance C5a connected between a clock input terminal CKTa and a node N9a between the diode elements Q30a and Q31a. In the same way, the charge pump circuit CP2 includes diode elements Q30b and Q31b, and a charge pump capacitance C5b connected between a clock input terminal CKTb and a node N9b between the diode elements Q30b and Q31b. That is, each of the charge pump circuits CP1 and CP2 shown in FIG. 13 has the same configuration as the charge pump circuit CP shown in FIG. 12.

The respective clock input terminals CKTa and CKTb of the charge pump circuits CP1 and CP2 receive clock signals having different phases. In this variation, the clock signals CLK and /CLK that drive the shift register circuit (the gate line driving circuit 30) are used as the clock signals. That is, as shown in FIG. 13, the clock signal CLK is input to the clock input terminal CKTa, and the clock signal /CLK is input to the clock input terminal CKTb.

Therefore, in the voltage generating circuit 33 shown in FIG. 13, the voltage output terminal VT is supplied with charge from the charge pump circuit CP1 when the clock signal CLK rises, and supplied with charge from the charge pump circuit CP2 when the clock signal /CLK rises. That is, the voltage output terminal VT is supplied with charge alternately by the clock signals CLK and /CLK, which solves the problem of potential reduction at the voltage output terminal VT.

This variation has shown an example in which the voltage generating circuit 33 is formed of two charge pump circuits, but the voltage generating circuit 33 may be formed of a single charge pump circuit (i.e., the configuration of FIG. 12), when the reduction of level of the voltage output terminal VT is permissible to some extent.

[Second Variation]

In the second variation, suggested is the voltage generation circuit capable of increasing the output potential VDD5 to a level higher than the level achieved by the configuration shown in FIG. 12 and FIG. 13.

Figure 14:
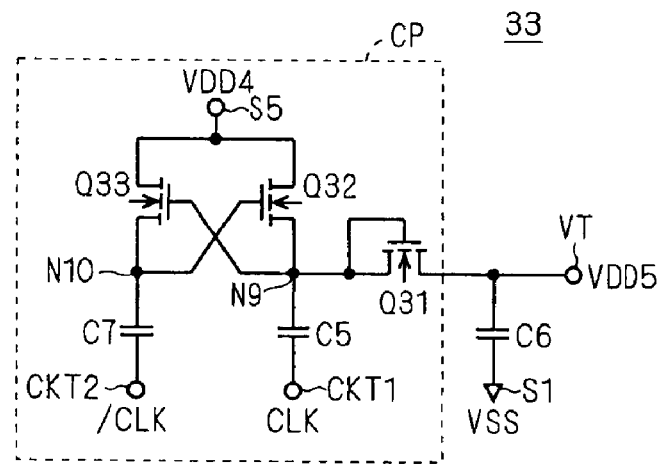
FIG. 14 is a circuit diagram showing the voltage generating circuit according to the second variation of the second embodiment.

FIG. 14 is a circuit diagram illustrating the configuration of the second variation of the voltage generating circuit 33 according to the second embodiment. In the present variation, the voltage generating circuit 33 also includes the charge pump circuit CP and the stabilizing capacitance C6, but the configuration of the charge pump circuit CP is different from that of FIG. 12.

As shown in FIG. 14, in the charge pump circuit CP according to the present variation, the transistor Q30 of FIG. 12 is replaced with a circuit including transistors Q32 and Q33 and a capacitive element C7.

The transistor Q32 is connected to the fifth power supply terminal S5 and the node N9, i.e., the anode of the diode element Q31. The transistor Q33 is connected between the fifth power supply terminal S5 and the gate node (hereinafter "node N10") of the transistor Q32, and the gate of the transistor Q33 is connected to the node N9. The capacitive element C7 is connected between the node N10 and the clock input terminal CKT2.

Clock signals having phases different from each other (activated periods at the H level do not overlap) are respectively input to the clock input terminals CKT1 and CKT2. The above clock signals may be the clock signals CLK and /CLK which drive the shift register circuit (gate line driving circuit 30). In the present variation, it is assumed that, as shown in FIG. 14, the clock signal CLK is input to the clock input terminal CKT1, and the cock signal /CLK is input to the clock input terminal CKT2.

Subsequently, the operation of the charge pump circuit CP in the voltage generating circuit 33 according to the present variation will be explained. Also in this variation, the amplitude of the clock signals CLK and /CLK is VDD, and the threshold voltage of the transistors in the voltage generating circuit 33 is Vth.

As described above, the node N9 of the circuit of FIG. 12 is charged to the level VDD4−Vth by the transistor Q30. In contrast, the node N9 of the charge pump circuit CP of FIG. 14 is charged to the level VDD4 by the circuit including the transistors Q32 and Q33 and the capacitive element C7. This is because the potential of the gate (node N10) of the transistor Q32 is increased when the clock signal /CLK rises, and at this time, the transistor Q32 operates in non-saturation region to charge the node N9.

Therefore, in the charge pump circuit CP according to the present variation, when the potential at the node N9 is increased by the rise of the clock signal CLK, the potential at the node N9 increases to VDD4+VDD. This increase of the potential at the node N9 causes the diode element Q31 to turn on, and accordingly, a current flows from the node N9 to the voltage output terminal VT. Therefore, the level of the voltage output terminal VT increases by a certain amount. On the contrary, the level of the node N9 decreases as much as the amount of charge flown out.

When the potential at the node N9 is increased, the transistor Q33 operates in non-saturation region. Therefore, the node N10 is charged to VDD4, which is the same level as that of the fifth power supply terminal S5. At this moment, since the potential at the node N9 is increased, the potential relationship causes the transistor Q32 to have such a configuration that the fifth power supply terminal S5 side is the source and the node N9 side is the drain. However, since the potential of the gate (node N10) and the potential of the source (the fifth power supply terminal S5) are the same, a current does not flow from the node N9 to the fifth power supply terminal S5. In other words, the transistor Q32 charges the node N9 using a current from the fifth power supply terminal S5, but the transistor Q32 serves as a rectifying element that blocks a current in the opposite direction.

When the potential at the node N9 was previously increased, the potential of the voltage output terminal VT was increased. Therefore, the potential at the node N9 is lower than that of the voltage output terminal VT. But the potential of the voltage output terminal VT is maintained at the raised level so that the diode element Q31 prevents a current flowing in a direction from the voltage output terminal VT to the node N9.

Thereafter, when the clock signal CLK falls, the potential at the node N9 is lowered by the coupling of the charge pump capacitance C5. At this moment, the level of the node N9 is less than VDD4 that it exhibited before the potential at the node N9 was increased (before the rise of the clock signal CLK). However, when the clock signal /CLK thereafter rises, the transistor Q32 operates in non-saturation region again to charge the node N9. Therefore, the level of the node N9 returns back to VDD4.

Subsequently, this operation is repeated at each input of the clock signals CLK and /CLK, and ultimately, the potential VDD5 at the voltage output terminal VT attains VDD4−Vth+VDD. Now, it is assumed that the above potentials VDD1 to VDD4 all have an equal value and that value is VDD which is equal to the H level of the clock signals CLK and /CLK. In such case, the final output potential VDD5 of the voltage generating circuit 33 is 2*VDD−Vth.

As described above, in the charge pump circuit CP according to the present variation, the transistor Q32 charges the node N9 in the non-saturation region, and therefore, the node of the node N9 is charged to a level higher than that in the circuit of FIG. 12 by the threshold voltage Vth of the transistor. Therefore, the level of the node N9 charged in response to the clock signal CLK is higher by Vth, which causes the ultimate potential of the voltage output terminal VT to be higher by Vth than that in the circuit of FIG. 12.

An example is shown in the present variation in which the clock signals CLK and /CLK are respectively input to the clock input terminals CKT1 and CKT2 of the voltage generating circuit 33. But as described above, any signals having phases different from each other (activated periods do not overlap) may be input to the clock input terminals CKT1 and CKT2.

In the charge pump circuit CP of FIG. 14, the capacitive element C7 should increase only the potential of the gate of the transistor Q32. Therefore, the capacitance of the capacitive element C7 may be smaller than the capacitance of the charge pump capacitance C5. Similarly, since the transistor Q33 only charges the gate of the transistor Q32, the on-state resistance of the transistor Q33 may be higher than that of the transistor Q32.

[Third Variation]

Figure 15:
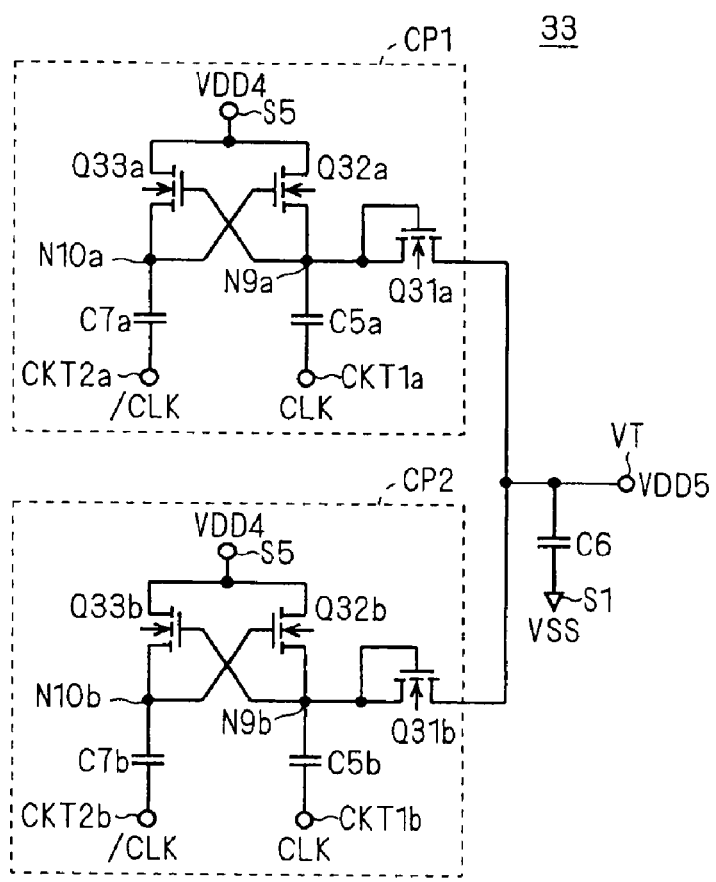
FIG. 15 is a circuit diagram showing the voltage generating circuit according to the third variation of the second embodiment.

FIG. 15 is a circuit diagram illustrating the configuration of the voltage generating circuit 33 according to the third variation. In the same manner as the second variation, the voltage generation circuit 33 has two charge pump circuits CP1 and CP2 connected in parallel with each other. In the present variation, however, each of the charge pump circuits CP1 and CP2 has the same structure as the charge pump circuit CP shown in FIG. 15.

The respective clock input terminals CKT1*a* and CKT1*b* (corresponding to the clock input terminal CKT1 of FIG. 15) of the charge pump circuits CP1 and CP2 receive clock signals having different phases. In this variation, the clock signals CLK and /CLK that drive the shift register circuit (the gate line driving circuit 30) are used as the clock signals. That is, as shown in FIG. 13, the clock signal CLK is input to the clock input terminal CKT1*a* of the charge pump circuit CP1, and the clock signal /CLK is input to the clock input terminal CKT1*b* of the charge pump circuit CP2.

The clock signal /CLK having the phase different from that of the clock signal CLK of the clock input terminal CKT1*a* is input to the clock input terminal CKT2*a* of the charge pump circuit CP1. Similarly, the clock signal CLK having the phase different from that of the clock signal /CLK of the clock input terminal CKT1*b* is input to the clock input terminal CKT2*b* of the charge pump circuit CP2.

Therefore, in the voltage generating circuit 33 shown in FIG. 15, the voltage output terminal VT is supplied with charge from the charge pump circuit CP1 when the clock signal CLK rises, and supplied with charge from the charge pump circuit CP2 when the clock signal /CLK rises. That is, the voltage output terminal VT is supplied with charge almost in the entire period either by the clock signal CLK or /CLK, which solves the problem of potential reduction at the voltage output terminal VT.

In the present variation, the voltage generating circuit 33 may be formed of a single charge pump circuit (i.e., the configuration of FIG. 14), when the reduction of level of the voltage output terminal VT is permissible to some extent.

Third Embodiment

Figure 16:
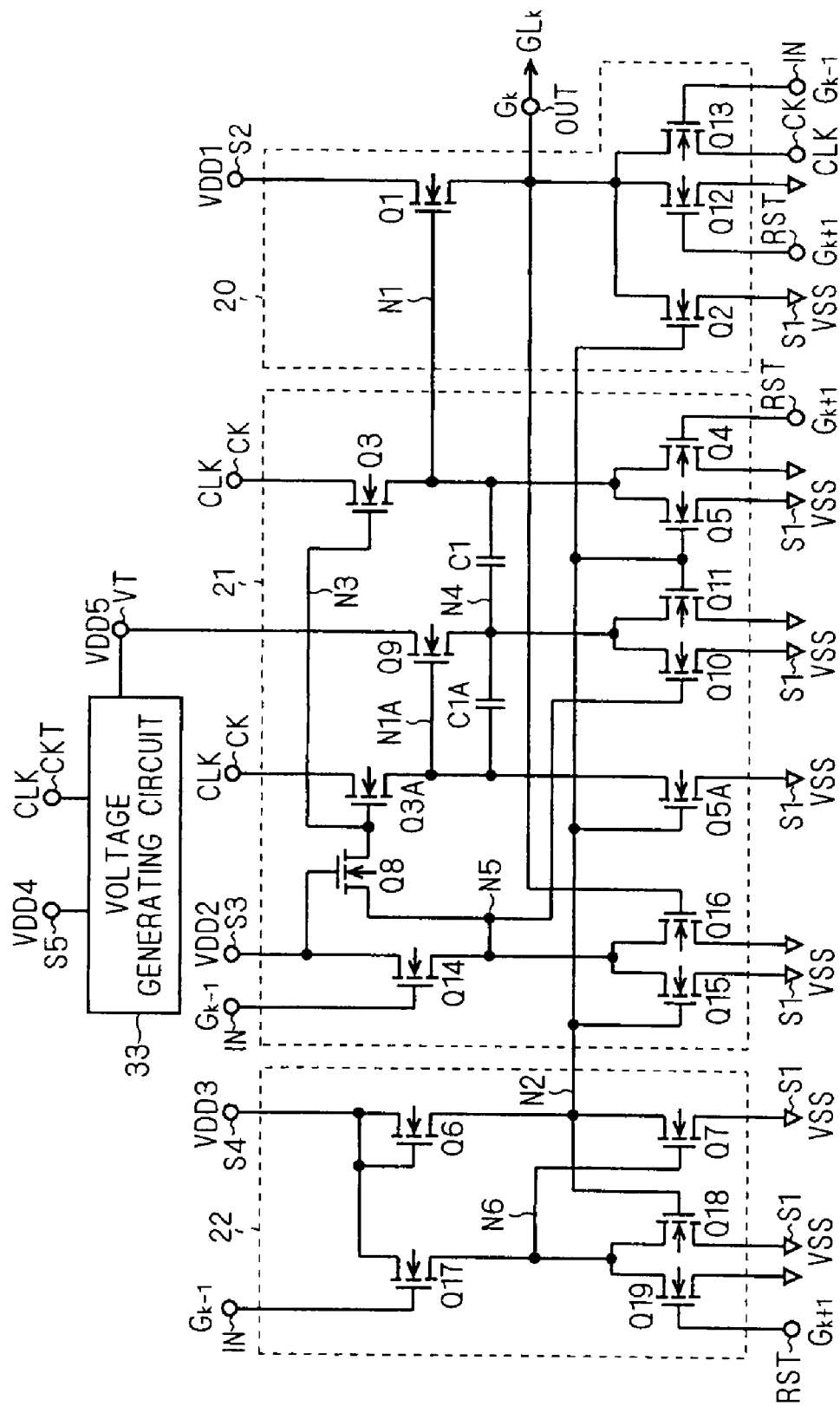
FIG. 16 is a circuit diagram showing the unit shift register according to the third embodiment.

FIG. 16 is a circuit diagram showing the unit shift register $SR_k$ according to the third embodiment. Compared with the unit shift register $SR_k$ of FIG. 10, this unit shift register $SR_k$ is configured such that the drain of the transistor Q9 is connected to the voltage generating circuit 33 explained in the second embodiment.

In the unit shift register $SR_k$ of FIG. 16, the gate (node N1A) of the transistor Q9 is separated from the node N1 having a large parasitic capacitance. Compared with the capacitive element C1A, the parasitic capacitance of the node N1A is so small that it can almost be disregarded. Accordingly, when the level of the node N4 increases, the node N1A is increased to approximately VDD+VDD5. Therefore, the transistor Q9 operates in non-saturation region to rapidly charge the node N4 to the potential VDD5.

As a result, the potential at the node N1 is rapidly increased by the capacitive element C1, and the raised level of the node N1 is higher than that of the case of FIG. 10. Therefore, the rise of the output signal $G_k$ can be made faster.

However, in the unit shift register $SR_k$ of FIG. 16, the clock signal CLK is also provided to the transistor Q3A in the same manner as the case of FIG. 10. Therefore, an attention should be paid to an occurrence of the capacitive coupling current flowing through the overlap capacitance of the transistor Q3A.

Fourth Embodiment

Figure 17:
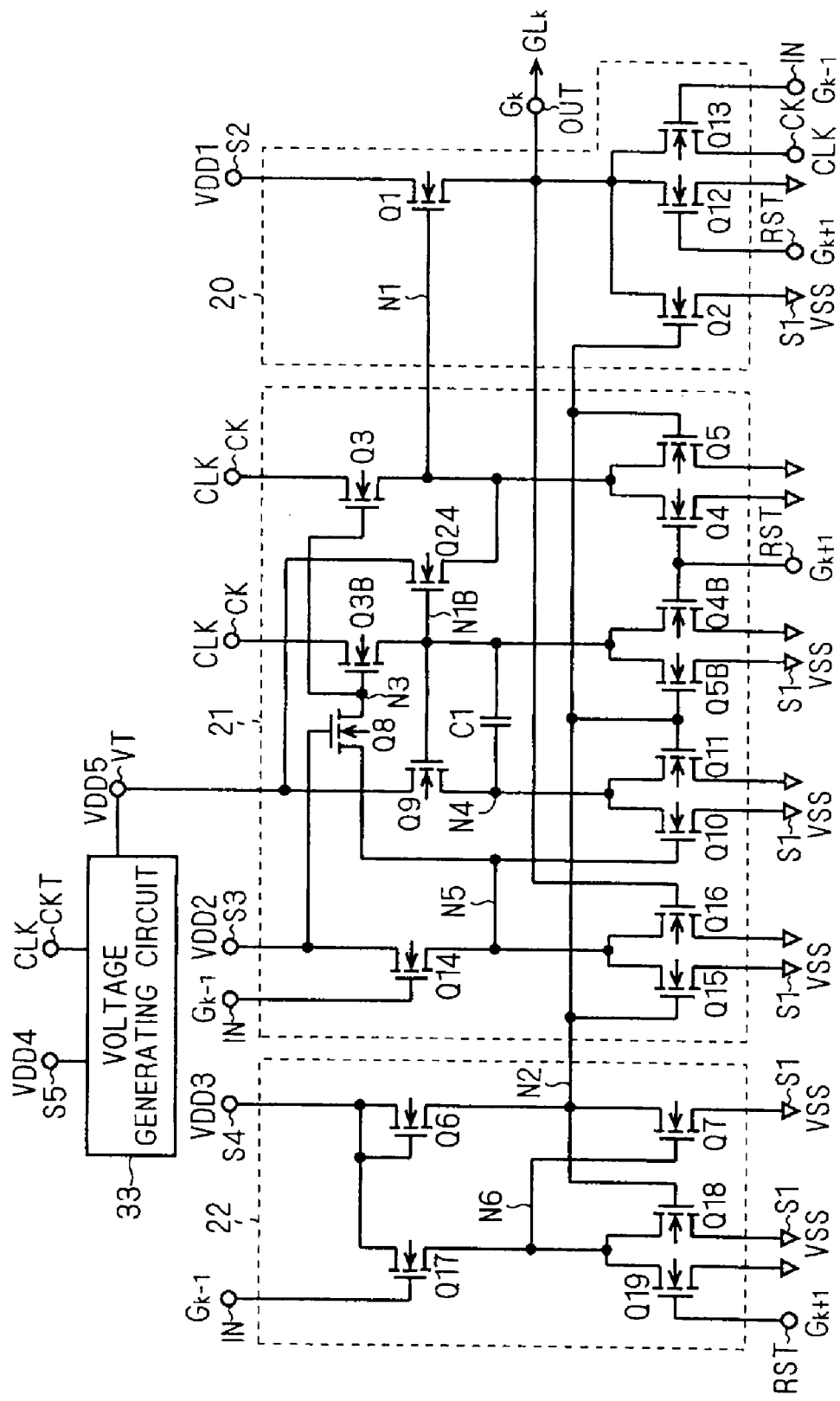
FIG. 17 is a circuit diagram showing the unit shift register according to the fourth embodiment.

FIG. 17 is a circuit diagram showing the unit shift register $SR_k$ according to the fourth embodiment. This unit shift register $SR_k$ is configured such that the output of the voltage generating circuit 33 is used to charge the node N1 instead of using the capacitive element C1 to increase the potential at the node N1, so that the node N1 attains a potential higher than the H level (VDD) of the clock signals CLK and /CLK.

As shown in FIG. 17, this unit shift register $SR_k$ is arranged with a circuit constituted by transistors Q3B to Q5B, which has the same configuration as that of the circuit constituted by the transistors Q3 to Q5. The gate of the transistor Q9 is separated from the node N1, and is connected to a connection node (defined as "node N1B") between the transistor Q3B and the transistors Q4B and Q5B. Further, the capacitive element C1 is also separated from the node N1, and is connected between the node N4 and the node N1B.

In this unit shift register $SR_k$, the drain of the transistor Q9 is connected to the voltage generating circuit 33 in the same manner as FIG. 16. Further, a transistor Q24 is connected between the voltage output terminal VT of the voltage generating circuit 33 and the node N1. The transistor Q24 charges the node N1 using the output of the voltage generating circuit 33 as a power supply. The gate of the transistor Q24 is connected to the node N1B.

The unit shift register $SR_k$ of FIG. 17 operates in substantially the same manner as the circuit of FIG. 3. However, the potential of the gate (node N1) of the transistor Q1 is not increased by the coupling through the capacitive element C1, and is increased to a level higher than the potential VDD by the charging of the transistor Q24.

The capacitive element C1 of FIG. 17 serves to increase the potential of the gate (node N1B) of the transistor Q24. The operation of increasing the potential at the node N1B is the same as the operation of increasing the potential at the node N1 in the circuit of FIG. 3.

The drain potential of the transistor Q9 is the potential VDD5, but the transistor Q9 operates in non-saturation region because when the transistor Q9 charges the node N4, the potential at the node N1B is increased by the coupling through the capacitive element C1 (in other words, the transistor Q9 and the capacitive element C1 constitute a bootstrap circuit). Therefore, the node N4 is charged to the potential. VDD5. The transistor Q24 used for charging the node N1 is not required of a driving capacity as large as that of the transistor Q1 used for charging the gate line $GL_k$, and therefore, the gate width of the transistor Q24 may be smaller by an order of magnitude than that of the transistor Q1. Therefore, the parasitic capacitance of the node N1B can be made so small, compared with the capacitive element C1, that it can almost be disregarded. Therefore, the level of the node N1B can be increased to a level close to VDD+VDD5.

Therefore, the transistor Q24 also operates in non-saturation region to charge the node N1, and the potential at the node N1 is increased to VDD5. As a result, the driving capacity of the transistor Q1 improves, and the rising rate of the output signal $G_k$ improves.

In the unit shift register $SR_k$ of FIG. 3, the potential at the node N1 (the gate of the transistor Q1) is increased by the capacitive element C1. Since the transistor Q1 used for charging the gate line $GL_k$ is required of a high driving capacity, the transistor Q1 has a large gate width and a large gate capacitance. Therefore, the parasitic capacitance of the node N1 is relatively large. The parasitic capacitance of the node N1 serves to reduce the increase of the potential at the node N1, and accordingly reduces the efficiency in increasing the potential.

In contrast, in the unit shift register $SR_k$ of FIG. 17, the potential at the node N1 is increased by the charging of the transistor Q24, and therefore, the amount of the increase of the potential thereof is irrelevant to the magnitude of the parasitic capacitance of the node N1. In other words, even when the gate width of the transistor Q1 is increased in order to improve the driving capacity of the unit shift register $SR_k$, the efficiency in increasing the potential at the node N1 is not reduced, which contributes to improving the driving capacity of the unit shift register $SR_k$.

Fifth Embodiment

Figure 18:
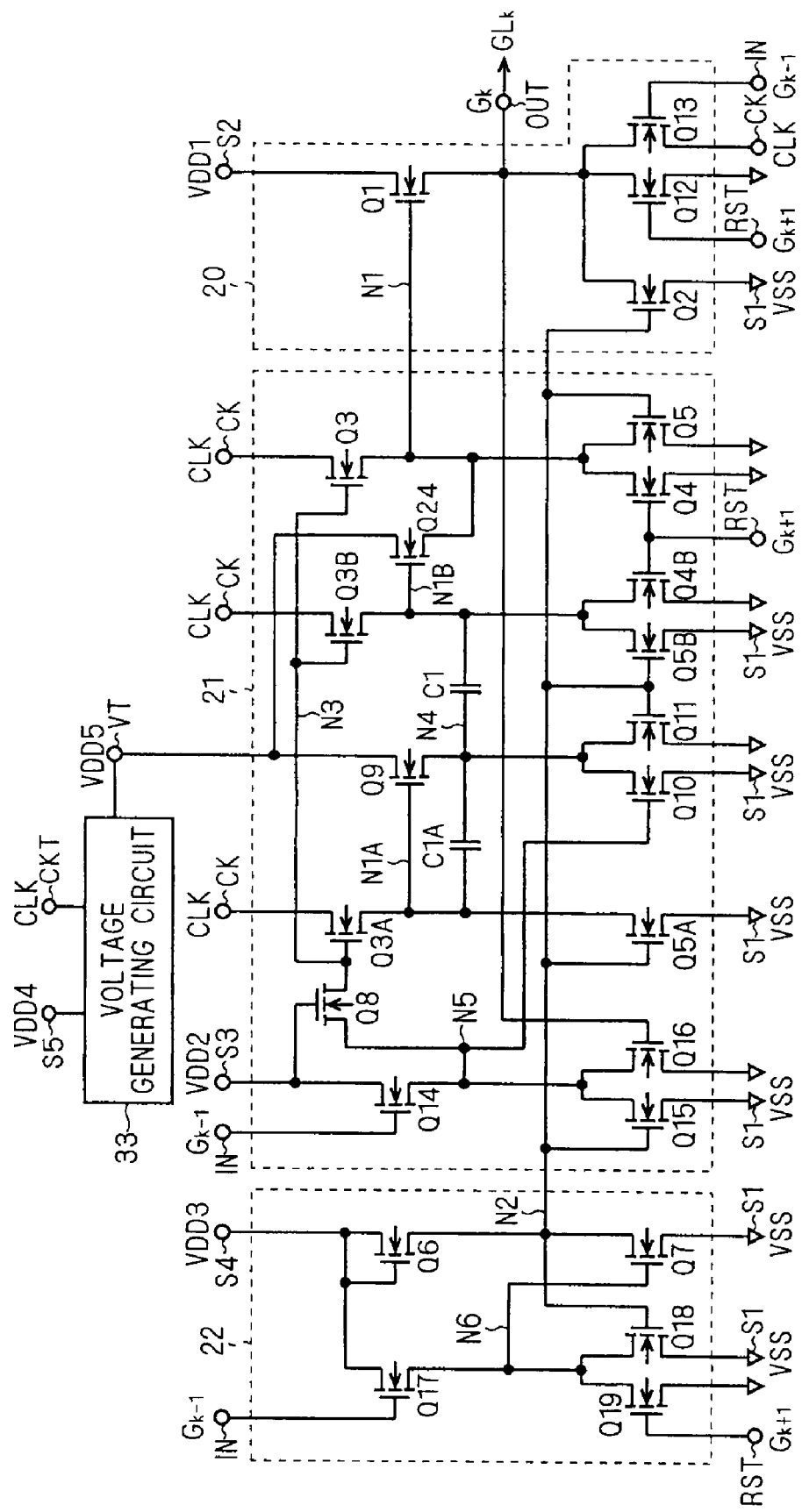
FIG. 18 is a circuit diagram showing the unit shift register according to the fifth embodiment.

FIG. 18 is a circuit diagram showing the unit shift register $SR_k$ according to the fifth embodiment. In the circuit of FIG. 18, the seventh variation of the first embodiment (FIG. 10) is applied to the unit shift register $SR_k$ according to the fourth embodiment (FIG. 17).

In other words, in the circuit of FIG. 18, the transistors Q3A and Q5A are arranged in parallel with the transistors Q3B and Q5B, and the gate of the transistor Q9 is connected to a connection node (node N1A) between the transistors Q3A and Q5A. Therefore, the gate of the transistor Q9 is separated from the node N1B. The capacitive element C1A is connected between the node N1A and the node N4.

The circuit constituted by the transistors Q3A and Q5A and the capacitive element C1A and the circuit constituted by the transistors Q3B and Q5B and the capacitive element C1 have the same configuration, and accordingly, operate in the same manner. In other words, the level of the node N1A changes in the same manner as that of the node N1B. Therefore, the unit shift register $SR_k$ of FIG. 18 operates in the same manner as the circuit of FIG. 17.

Since the node N1A of the unit shift register $SR_k$ of FIG. 18 is not connected to the gate capacitance of the transistor Q9, the parasitic capacitance of the node N1A is less than that of FIG. 17. Therefore, the circuit of FIG. 18 can increase the potential of the gate of the transistor Q9 more efficiently than the circuit of FIG. 17. Therefore, the rise of the node N4 becomes faster, and accordingly, the rise of the node N1B becomes faster. As a result, the increasing rate of the potential at the node N1 also becomes larger, and the rise of the output signal $G_k$ also becomes faster.

However, since the clock signal CLK is also provided to the transistor Q3A in the same manner as the circuit of FIG. 10, an attention should be paid to occurrence of the capacitive coupling current flowing through the overlap capacitance of the transistor Q3A.

Sixth Embodiment

Figure 19:
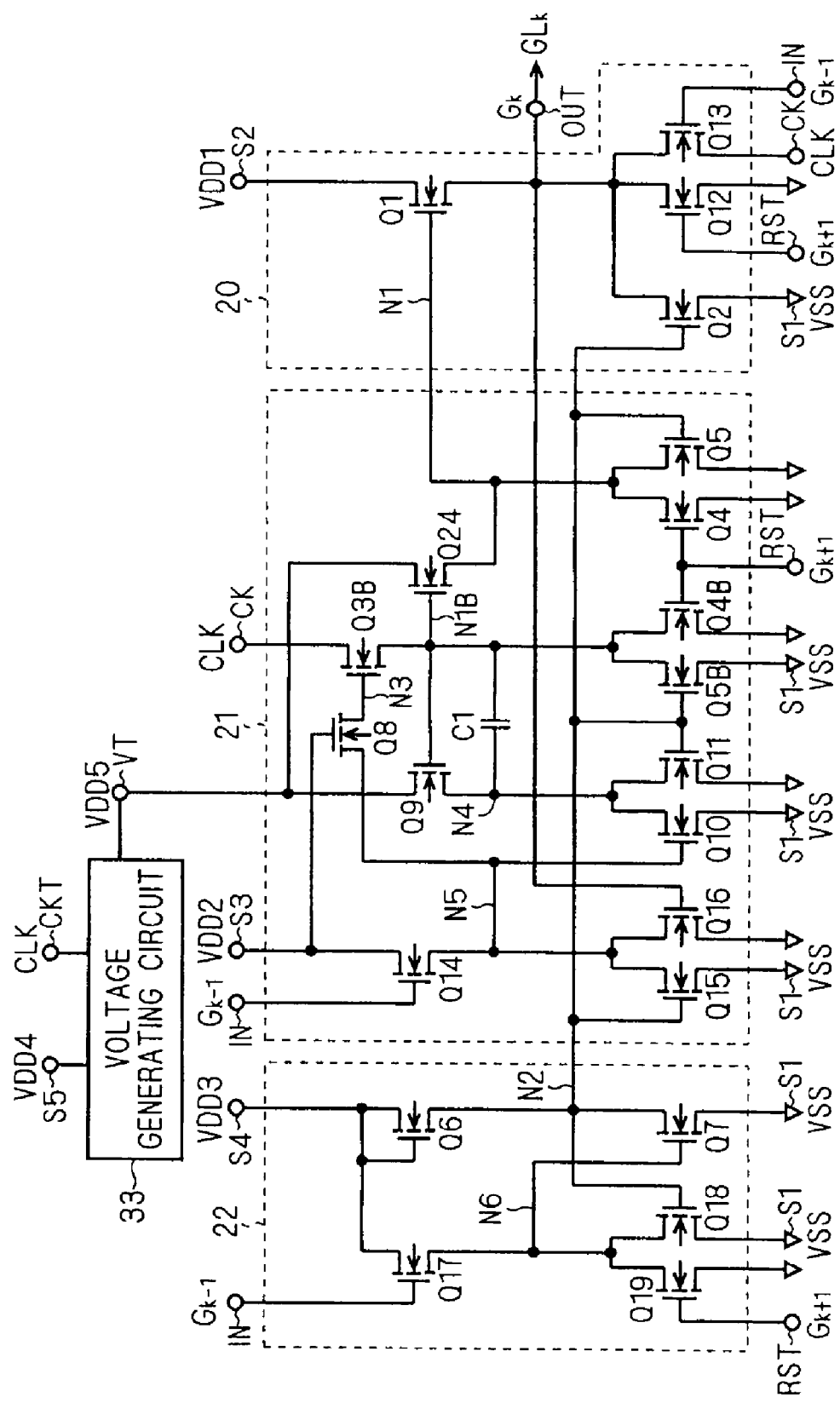
FIG. 19 is a circuit diagram showing the unit shift register according to the sixth embodiment.

FIG. 19 is a circuit diagram showing the unit shift register $SR_k$ according to the sixth embodiment. This unit shift register $SR_k$ is the same as the circuit of FIG. 17 except that the transistor Q3 is omitted.

In the circuit of FIG. 17, the node N1 is charged (pre-charged) to VDD by the transistor Q3 in accordance with the rise of the clock signal CLK, and further, the node N1 is charged (potential is increased) to VDD5 by the transistor Q24. In contrast, in the unit shift register $SR_k$ of FIG. 19, the node N1 is charged entirely by the transistor Q24.

According to the present embodiment, the power consumption can be reduced since the transistor Q3 is omitted. However, a delay occurs in a time at which the node N1 is charged, and accordingly, the rise of the output terminal OUT is delayed, because the node N1 is not charged (pre-charged) by the transistor Q3.

In the circuit of FIG. 18, the transistor Q3 can also be omitted, and accordingly, the power consumption can be reduced.

In the unit shift register $SR_k$ according to the present embodiment, the gate of the transistor Q16 may be connected to the node N1 instead of the output terminal OUT. In each of the above embodiment, a delay time from when the node N1 begins to be charged to when the level of the node N4 is increased is ensured by controlling the transistor Q16 with the output signal $G_k$. In the present embodiment, however, a time at which the node N1 is charged is delayed as described above. Therefore, even where the gate of the transistor Q16 is connected to the node N1, the delay time can be sufficiently ensured in the present embodiment. When the gate of the transistor Q16 is connected to the node N1, the gate of the transistor Q16 is separated from the gate line $GL_k$, which also brings about an effect of preventing the operation of the transistor Q16 from being affected by the noise on the gate line $GL_k$.

Seventh Embodiment

In the seventh embodiment, the present invention is applied to a shift register capable of changing the shift direction of the signal. The gate line driving circuit 30 constituted by such shift register can scan in both directions.

Figure 20:
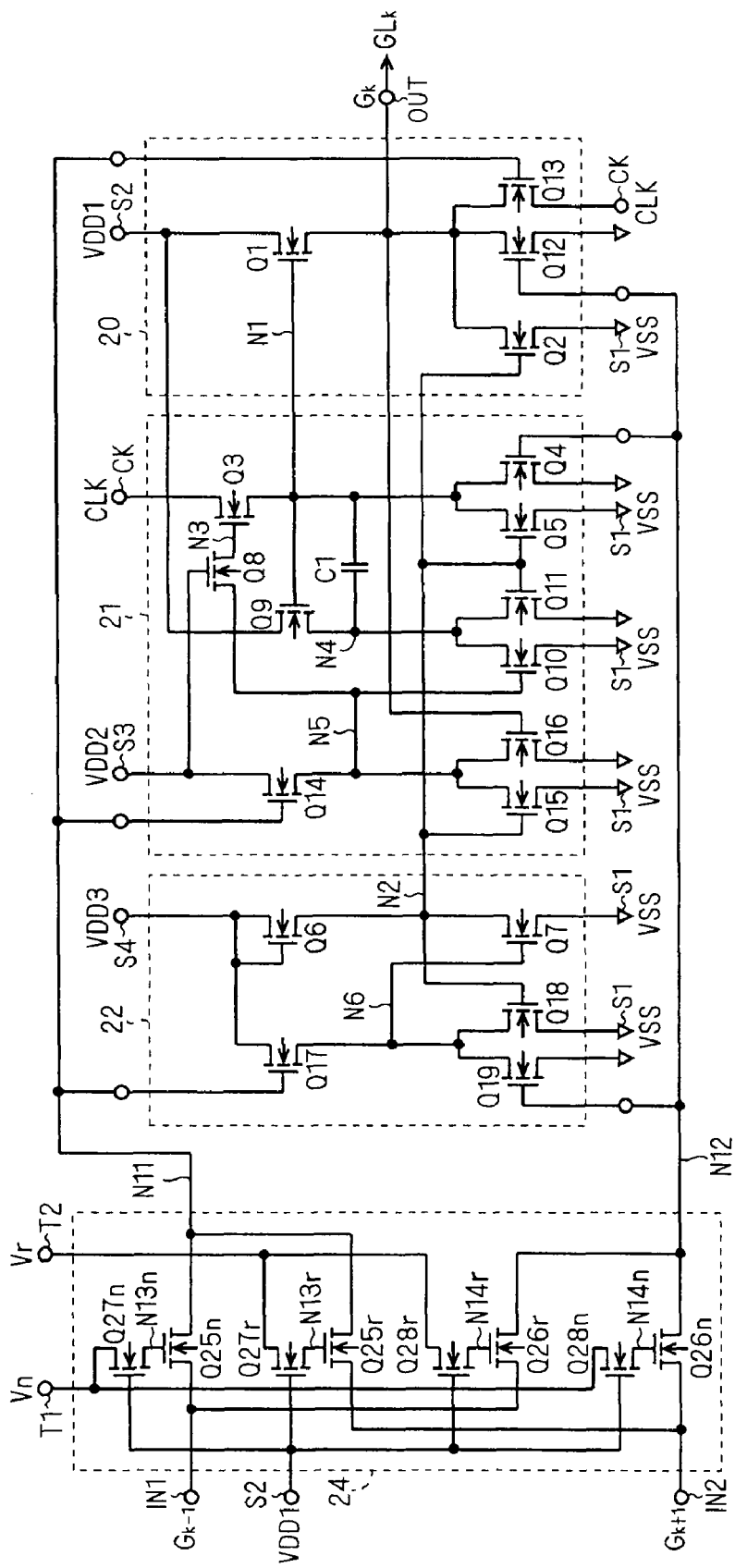
FIG. 20 is a circuit diagram showing the unit shift register according to the seventh embodiment.

FIG. 20 is a circuit diagram showing the unit shift register $SR_k$ according to the seventh embodiment. Compared with the circuit of FIG. 3, this unit shift register $SR_k$ is arranged with a switching circuit 24 for switching the shift direction of the signal.

The circuit of FIG. 3 has a limitation in that the output signal $G_{k-1}$ of the preceding stage is input only to the gates of the transistors Q13, Q14 and Q17 (input terminal IN), and the output signal of the subsequent stage is input only to the gates of the transistors Q4, Q12 and Q19 (reset terminal RST). In contrast, the switching circuit 24 of FIG. 20 can switch the two signals in accordance with the levels of the first and second voltage signals Vn and Vr.

As shown in FIG. 20, the switching circuit 24 includes transistors Q25n, Q25r, Q26n, Q26r, Q27n, Q27r, Q28n and Q28r. The switching circuit 24 includes first and second input terminals IN1 and IN2 respectively receiving the output signal $G_{k-1}$ of the preceding stage and the output signal $G_{k+1}$ of the subsequent stage and first and second voltage signal terminals T1 and T2 respectively receiving the first and second voltage signals Vn and Vr.

The switching circuit 24 has two output ends, which are defined as "node N11" and "node N12." In the present embodiment, the gates of the transistors Q13, Q14 and Q17 are connected to the node N11, and the gates of the transistors Q4, Q12 and Q19 are connected to the node N12. The node N11 corresponds to the input terminal IN of the circuit of FIG. 3, and the node N12 corresponds to the reset terminal RST of the circuit of FIG. 3. In other words, the switching circuit 24 switches which of the output signal $G_{k-1}$ of the preceding stage and the output signal $G_{k+1}$ of the subsequent stage is provided to the input terminal IN (node N11) of FIG. 3, and switches which of them is provided to the reset terminal RST (node N12) of FIG. 3.

As shown in FIG. 20, the transistor Q25n is connected to the first input terminal IN1 and the node N11, and the gate of the transistor Q25n is connected to the first voltage signal terminal T1 via the transistor Q27n. The transistor Q25r is connected between the second input terminal IN2 and the node N11, and the gate of the transistor Q25r is connected to the second voltage signal terminal T2 via the transistor Q27r. The transistor Q26n is connected between the second input terminal IN2 and the node N12, and the gate of the transistor Q26n is connected to the first voltage signal terminal T1 via the transistor Q28n. The transistor Q26r is connected between the first input terminal IN1 and the node N12, and the gate of the transistor Q26r is connected to the second voltage signal terminal T2 via the transistor Q28r. The gates of the transistors Q27n, Q27r, Q28n and Q28r are all connected to the second power supply terminal S2.

Herein, the first and second voltage signals Vn and Vr are control signals for determining the shift direction of the signal (scan direction). When the unit shift register $SR_k$ is caused to perform shift operation on the signal in a direction from the preceding stage to the subsequent stage (defined as "normal direction"), the first voltage signal Vn is configured to be at the H level and the second voltage signal Vr is configured to be at the L level. When the unit shift register $SR_k$ is caused to perform shift operation on the signal in a direction from the subsequent stage to the preceding stage (defined as "reverse direction"), the first voltage signal Vn is configured to be at the L level and the second voltage signal Vr is configured to be at the H level.

The operation of the switching circuit 24 will be hereinafter explained. As shown in FIG. 20, nodes connected to the gates of the transistor Q25n, Q25r, Q26n, Q26r are respectively defined as nodes N13n, N13r, N14n, N14r.

When the first voltage signal Vn is at the H level and the second voltage signal Vr is at the L level, the nodes N13n and N14n attain the H level (VDD−Vth), and the nodes N13r and N14r attain the L level (VSS). Therefore, the transistor Q25n and Q26n are on-state, and the transistors Q25r and Q26r are off-state. Therefore, the output signal $G_{k-1}$ of the preceding stage input to the first input terminal IN1 is provided to the node N11, and the output signal $G_{k+1}$ of the subsequent stage input to the second input terminal IN2 is provided to the node N12.

In this case, the unit shift register $SR_k$ of FIG. 20 is equivalent to that of FIG. 3. Therefore, the gate line driving circuit 30 including the cascade-connected unit shift registers $SR_k$ of FIG. 20 can perform shift operation in normal direction, i.e., shift operation on the signal in the order of the unit shift registers $SR_1$, $SR_2$, $SR_3$, . . . .

At the rise of the output signal $G_{k-1}$ of the preceding stage, the potential at the node N13n is increased by the coupling through the capacitance between the gate and channel of the transistor Q25n, and the transistor Q25n operates in non-saturated region. Therefore, at that moment, the level of the node N11 is the potential VDD, which is the same as the potential of the output signal $G_{k-1}$ of the preceding stage. Similarly, at the rise of the output signal $G_{k+1}$ of the subsequent stage, the potential at the node N14n is increased by the coupling through the capacitance between the gate and channel of the transistor Q26n, and the transistor Q26n operates in non-saturated region. Therefore, at that moment, the level of the node N12 is the potential VDD, which is the same as the potential of the output signal $G_{k+1}$ of the subsequent stage.

On the other hand, when the first voltage signal Vn is at the L level and the second voltage signal Vr is at the H level, the nodes N13r and N14r attain the H level (VDD−Vth), and the nodes N13n and N14n attain the L level (VSS). Therefore, the transistor Q25r and Q26r are on-state, and the transistors Q25n and Q26n are off-state. Therefore, the output signal $G_{k-1}$ of the preceding stage input to the first input terminal IN1 is provided to the node N12, and the output signal $G_{k+1}$ of the subsequent stage input to the second input terminal IN2 is provided to the node N11.

In this case, the unit shift register $SR_k$ of FIG. 20 operates to activate the output signal Gk in accordance with activation of the output signal $G_{k+1}$ of the subsequent stage, and operates to deactivate the output signal Gk in accordance with activation of the output signal $G_{k-1}$ of the preceding stage. Therefore, the gate line driving circuit 30 including the cascade-connected unit shift registers $SR_k$ of FIG. 20 can perform shift operation in reverse direction, i.e., shift operation on the signal in the order of the unit shift registers $SR_n$, $SR_{n-1}$, $SR_{n-2}$, . . . .

At the rise of the output signal $G_{k+1}$ of the subsequent stage, the potential at the node N13r is increased by the coupling through the capacitance between the gate and channel of the transistor Q25r, and the transistor Q25r operates in non-saturated region. Therefore, at that moment, the level of the node N11 is the potential VDD, which is the same as the potential of the output signal $G_{k+1}$ of the subsequent stage. Similarly, at the rise of the output signal $G_{k-1}$ of the preceding stage, the potential at the node N14r is increased by the coupling through the capacitance between the gate and channel of the transistor Q26r, and the transistor Q26r operates in non-saturated region. Therefore, at that moment, the level of the node N12 is the potential VDD, which is the same as the potential of the output signal $G_{k-1}$ of the preceding stage.

The output circuit 20, the pull-up driving circuit 21, and the pull-down driving circuit 22 of FIG. 20 operate in the same manner as those of FIG. 3. Therefore, the unit shift register $SR_k$ according to the present embodiment provides the same effects as those of the first embodiment. However, the output signal $G_{k-1}$ of the preceding stage and the output signal $G_{k+1}$ of the subsequent stage are provided through the switching circuit 24. Therefore, compared with the circuit of FIG. 3, a slight delay occurs in a response to the output signal $G_{k-1}$ of the preceding stage and the output signal $G_{k+1}$ of the subsequent stage.

The present embodiment can be applied to the unit shift register $SR_k$ of any of the above embodiments 1 to 6.

Eighth Embodiment

In the unit shift register $SR_k$ of each of the above embodiments, the gate of the transistor Q16 is connected to the output terminal OUT. Therefore, the operation of the transistor Q16 is likely to be affected by the noise occurring on the gate line $GL_k$ connected to the output terminal OUT, and the noise may cause the unit shift register $SR_k$ to malfunction. In the present embodiment, an example for alleviating this issue is shown.

Figure 21:
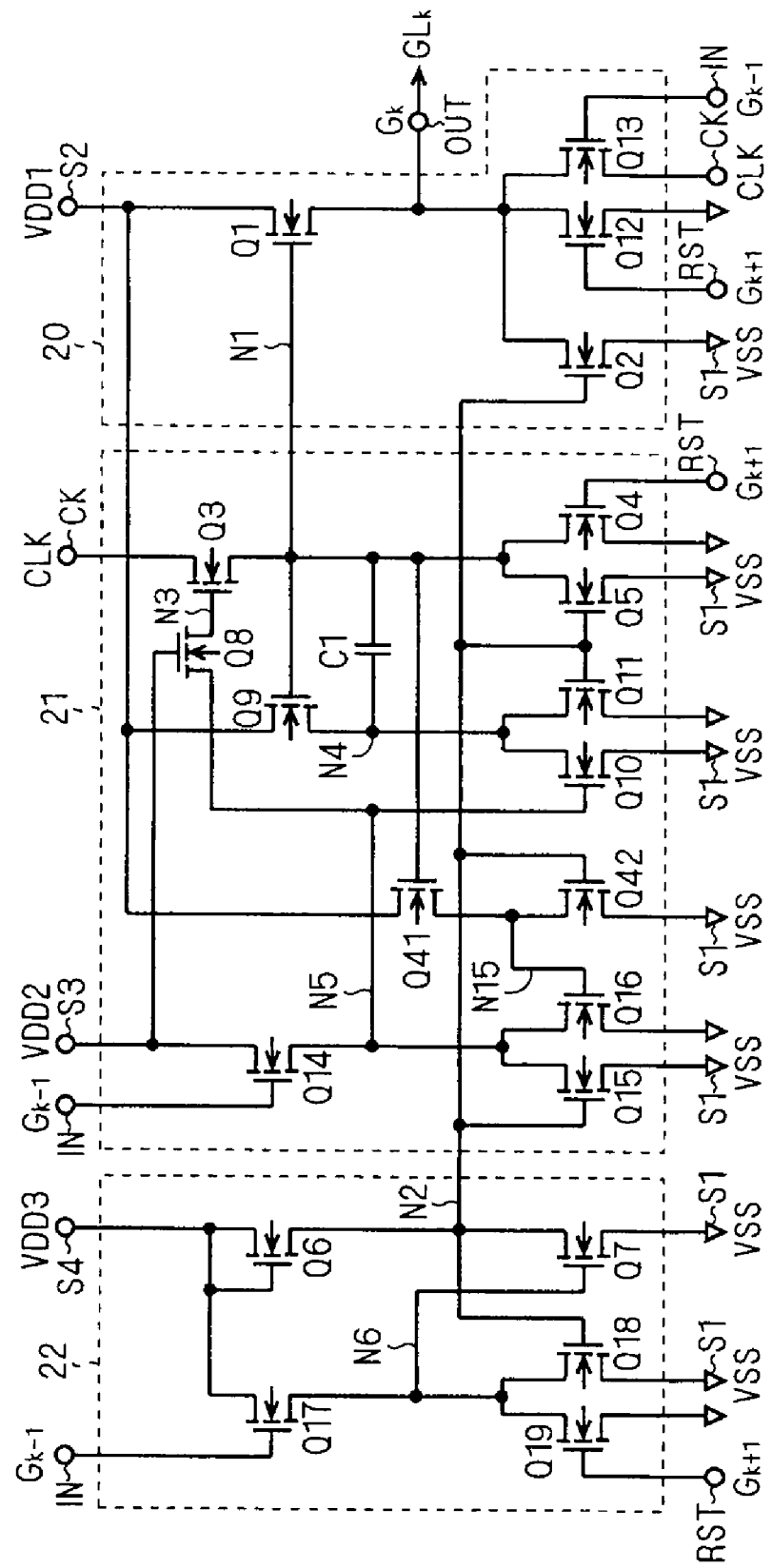
FIG. 21 is a circuit diagram showing the unit shift register according to the eighth embodiment.

FIG. 21 is a circuit diagram showing a unit shift register according to the eighth embodiment. This unit shift register $SR_k$ is configured such that the signal of the node N1 is provided to the gate of the transistor Q16 via a push-pull buffer circuit. The gate of the transistor Q16 is separated from the output terminal OUT (gate line $GL_k$), and accordingly, the operation of the transistor Q16 is not affected by the noise occurring on the gate line $GL_k$.

Now, a node connecting to the gate of the transistor Q16 is defined as "node N15." The above buffer circuit includes a transistor Q41 connected between the node N15 and the second power supply terminal S2 and a transistor Q42 connected between the node N15 and the first power supply terminal S1. The gate of the transistor Q41 is connected to the node N1, and the gate of the transistor Q42 is connected to the node N2. As can be seen from the timing chart of FIG. 4, when the node N1 is at the H level, the node N2 is at the L level. Therefore, the transistors Q41 and Q42 do not turn on at the same time. In other words, the buffer circuit performs push-pull operation, and a through-current does not flow through the transistors Q41 and Q42.

In each of the above embodiments, the delay time from when the node N1 begins to be charged to when the level of the node N4 is increased is ensured by controlling the transistor Q16 with the output signal $G_k$. In other words, the delay time is ensured by the charging time of the output terminal OUT charged by the transistor Q1. In contrast, in the present embodiment, the delay time can be ensured by the charging time of the node N15 charged by the transistor Q41. Therefore, the circuit of FIG. 21 can operate in the same manner as the circuit of FIG. 3.

The present embodiment can be applied to the unit shift register $SR_k$ according to any of the above embodiments 1 to 7. However, in a case of the fifth variation of the first embodiment (FIG. 8), it is not necessary to apply the present embodiment. The gate of the transistor Q16 may be connected to the output terminal OUTD of the second output signal $GD_k$, so that the gate of the transistor Q16 is separated from the output terminal OUT in the same manner as the present embodiment, and the noise of the gate line $GL_k$ does not affect the operation of the transistor Q16.

While the invention has been shown and described in detail, the foregoing description is in all aspects illustrative and not restrictive. It is therefore understood that numerous modifications and variations can be devised without departing from the scope of the invention.

What is claimed is:

1. A shift register circuit comprising:
    an input terminal;
    an output terminal;
    a clock terminal;
    a first transistor for charging said output terminal by providing a constant first power supply potential to said output terminal;
    a second transistor for discharging said output terminal;
    a pull-up driving circuit for driving said first transistor; and
    a pull-down driving circuit for driving said second transistor,
    wherein said pull-up driving circuit includes:
        a third transistor for providing a clock signal provided at said clock terminal to a first node connected to a control electrode of said first transistor; and
        a boosting circuit for increasing a potential at said first node,
    wherein a control electrode of said third transistor is charged when an input signal input to said input terminal is activated, and the control electrode of said third transistor is discharged when said first node is charged by activation of the clock signal,
    wherein said pull-down driving circuit discharges a control electrode of said second transistor before the charging of said first node by activation of the clock signal begins,
    and wherein said boosting circuit increases the potential at said first node after the control electrode of said third transistor is discharged.

2. The shift register circuit according to claim 1, wherein said boosting circuit includes a first capacitive element whose one end is connected to said first node, and increases the potential at said first node by charging said second node connected to the other end of said first capacitive element.

3. The shift register circuit according to claim 2, wherein said boosting circuit charges said second node by providing to said second node a second power supply potential larger in absolute value than the first power supply potential.

4. The shift register circuit according to claim 2, wherein said boosting circuit includes a bootstrap circuit containing a load transistor for charging said second node and having a control electrode connected to said first node,
    and a potential at the control electrode of said load transistor is increased by said first capacitive element in accordance with charging of said second node.

5. The shift register circuit according to claim 2, wherein said boosting circuit includes a bootstrap circuit containing a load transistor for charging said second node and a second capacitive element connected between a control electrode of said load transistor and said second node,
    and a potential at the control electrode of said load transistor is increased by said second capacitive element in accordance with charging of said second node.

6. The shift register circuit according to claim 1 further comprising a fourth transistor for discharging said output terminal when a reset signal input to a predetermined reset terminal is activated.

7. The shift register circuit according to claim 6, wherein said pull-down driving circuit discharges the control electrode of said second transistor when the input signal is activated, and charges the control electrode of said second transistor when the reset signal is activated.

8. The shift register circuit according to claim 1 further comprising a fourth transistor for discharging said output terminal,
    wherein another clock signal having a phase different from the clock signal input to said clock terminal is provided to a control electrode of said fourth transistor during at least an activated period of an output signal output from said output terminal.

9. The shift register circuit according to claim 8, wherein said pull-down driving circuit discharges the control electrode of said second transistor when the input signal is activated, and charges the control electrode of said second transistor when a signal provided to the control electrode of said fourth transistor is activated.

10. The shift register circuit according to claim 1, wherein said pull-up driving circuit further includes a fifth transistor connected between said first node and said clock terminal and having a control electrode connected to said output terminal.

11. The shift register circuit according to claim 1, further including a sixth transistor connected between said output terminal and said clock terminal and having a control electrode connected to said input terminal.

12. A multiple-stage shift register circuit including a plurality of cascade-connected shift register circuits,
    wherein each stage of said multiple-stage shift register circuit is the shift register circuit according to claim 1, and further comprises
    a switching circuit receiving an output signal from a preceding stage and an output signal from a subsequent stage and capable of switching which of the output signal received from said preceding stage and the output signal received from said subsequent stage is provided to said input terminal.

* * * * *